(12) United States Patent
Hirsch

(10) Patent No.: US 10,684,308 B1
(45) Date of Patent: Jun. 16, 2020

(54) METHODS FOR STABILIZING BIOLOGICAL AND SOFT MATERIALS FOR ATOM PROBE TOMOGRAPHY

(71) Applicant: Gregory Hirsch, Pacifica, CA (US)

(72) Inventor: Gregory Hirsch, Pacifica, CA (US)

( * ) Notice: Subject to any disclaimer, the term of this patent is extended or adjusted under 35 U.S.C. 154(b) by 0 days.

(21) Appl. No.: 16/212,494

(22) Filed: Dec. 6, 2018

Related U.S. Application Data

(60) Provisional application No. 62/597,267, filed on Dec. 11, 2017.

(51) Int. Cl.
*G01Q 30/20* (2010.01)
*G01Q 60/00* (2010.01)

(52) U.S. Cl.
CPC ............. *G01Q 30/20* (2013.01); *G01Q 60/00* (2013.01)

(58) Field of Classification Search
CPC ................................ G01Q 30/20; G01Q 60/00
See application file for complete search history.

(56) References Cited

U.S. PATENT DOCUMENTS

| | | | | |
|---|---|---|---|---|
| 4,829,177 A * | 5/1989 | Hirsch | ............... | G01N 23/2273 250/306 |
| 5,153,901 A * | 10/1992 | Shoulders | ............... | B82Y 10/00 313/131 A |
| 6,692,327 B1 * | 2/2004 | Deguchi | ............... | H01J 1/304 313/309 |
| 8,702,927 B2 | 4/2014 | Bau et al. | | |
| 8,877,518 B2 | 11/2014 | Bau et al. | | |
| 2009/0160307 A1 * | 6/2009 | Ueda | ............... | H01J 1/3044 313/336 |
| 2010/0181493 A1 * | 7/2010 | Sudraud | ............... | H01J 27/26 250/396 R |
| 2010/0233941 A1 * | 9/2010 | Chen | ............... | B02C 19/066 451/91 |
| 2013/0276599 A1 * | 10/2013 | Deshaye | ............... | B23B 5/00 82/1.11 |

(Continued)

OTHER PUBLICATIONS

Bau, "Carbon-based nanopipettes for single cell injection", http://upenn.technologypublisher.com/technology/25411, Nov. 17, 2018, University of Pennsylvania, Philadelphia, PA, USA.

(Continued)

*Primary Examiner* — Nicole M Ippolito
*Assistant Examiner* — Sean M Luck
(74) *Attorney, Agent, or Firm* — Asif Ghias

(57) ABSTRACT

Techniques are disclosed for stabilizing soft specimen traditionally considered too fragile for APT instruments. These specimens include biological samples, polymers and other fragile materials. For this purpose, a protective structure is disclosed that surrounds the sides of the specimen by supporting walls while only exposing the very end or terminus of the specimen to the electrostatic field of the APT instrument. The protective structure may take the form of a nanoscale conical grinder which continually machines the specimen to regenerate the terminus of the specimen in-situ. Alternately, the protective structure may take the form of a nanopipette in which the specimen is first frozen before undergoing field evaporation together with the tip of the nanopipette. Heretofore only routinely possible for rigid and hard materials, the design thus extends APT analysis to produce three-dimensional atomic-scale maps of soft specimens.

32 Claims, 17 Drawing Sheets

(56) References Cited

U.S. PATENT DOCUMENTS

| | | | | |
|---|---|---|---|---|
| 2015/0041652 A1* | 2/2015 | Akutsu | ............... | H01J 37/285 |
| | | | | 250/336.1 |
| 2015/0123010 A1* | 5/2015 | Hirsch | ............... | H01J 37/073 |
| | | | | 250/424 |
| 2016/0365216 A1* | 12/2016 | Lozano | ............... | H01J 1/304 |
| 2017/0076901 A1* | 3/2017 | Hirsch | ............... | C25D 3/50 |

OTHER PUBLICATIONS

Dmitrieva et al., "Chemical gradients across phase boundaries between martensite and austenite in steel studied by atom probe tomography and simulation", Acta Materialia, Oct. 18, 2010, pp. 364-374, vol. 59, ScienceDirect, Elsevier, Amsterdam, The Netherlands.

Kelly et al., "Invited Review Article: Atom Probe Tomography", Review of Scientific Instruments, Mar. 30, 2007, pp. 031101-1 through 031101-20, vol. 78, American Institute of Physics, College Park, MD, USA.

Koelling et al., "Towards, Mapping of Trace Elements in Bio-Materials", APT&M Conference, Jun. 13, 2018, Gaithersburg, MD, USA.

Nadiaprobes, "Data Sheet & Supporting Documentation", www.thindiamond.com, Nov. 7, 2012, Romeoville, IL, USA.

Singhal et al., "Small diameter carbon nanopipettes", Nanotechnology, Nov. 30, 2009, 015304 (9pp), vol. 21, IOP Publishing, Bristol, UK.

* cited by examiner

METHODS FOR STABILIZING BIOLOGICAL AND SOFT MATERIALS FOR ATOM PROBE TOMOGRAPHY

RELATED APPLICATIONS

This application claims priority from U.S. Provisional Patent Application No. 62/597,267 filed on 11 Dec. 2017 and which is incorporated herein by reference for all purposes in its entirety.

GOVERNMENT LICENSE RIGHTS

This invention is made by government support under grant number DE-SC0018599, entitled "Methods for Atom Probe Tomography of Biological Materials" and awarded by the Department of Energy, Office of Science, on Apr. 3, 2018.

FIELD OF THE INVENTION

This invention relates generally to atom probe tomography (APT) and more specifically to analyzing soft materials such as biological samples using APT.

BACKGROUND ART

Atom probe tomography (APT) is an unusual and emerging imaging and microanalysis technique enabling three-dimensional atomic-scale mapping of chemical composition in materials. Thus far, APT has been applied almost exclusively to rigid inorganic materials. Samples are fabricated into needle-like specimens terminated with extremely sharp tips. Specimens are formed either from bulk materials, or in some instances machined from more complex objects such as semiconductor devices.

These specimens are then cryogenically cooled and analyzed in vacuum using highly controlled atom-by-atom field evaporation from the tip surface. Atoms leave the quasi-spherical tip as ions, are accelerated by a high electric field away from the tip, and impinge on an ion detector. This detector has single-ion sensitivity, along with high spatial and temporal resolution. Radial projection of ions from tip to the detector plane is used to obtain the initial position of atoms or molecules on the tip surface. Simultaneously, time-of-flight measurements permit very precise determination of the mass-to-charge (m/z) ratio of individual ions. The resultant data sets of these ion detections permit three-dimensional reconstruction of the atomic structure of the original needle-like specimen volume.

It is easy to see that this is a completely destructive process. Field evaporation of individual surface ions is achieved at a precise time by either electrical pulsing, or with the assistance of short-duration laser pulses focused onto the tip. The latter method permits the analysis of samples with low electrical conductivity. Within the constraints of this unusual specimen geometry and complete disintegration of the specimen into individual ions, APT can be regarded as the ultimate microanalysis technique.

APT can be traced back to the pioneering Field Ion Microscopy (FIM) experiments of E. W. Müller in the 1950s. At his Pennsylvania State University laboratory, individual atoms forming the lattice of refractory-metal tips were directly imaged for the first time. In 1967, atom probe field ion microscope (APFIM) was also developed in this laboratory as an extension of the capabilities of the basic field ion microscopy (FIM) instrument. Using APFIM, single surface atoms individually preselected in real-time from a FIM image of a specimen tip could be chemically identified.

This is accomplished by pulsed field evaporation of the selected atom (along with other atoms) and having the preselected atom pass through a hole in the phosphor imaging screen. APFIM analysis is accomplished by determining the mass-to-charge (m/z) ratio of the preselected atom along with a time-of-flight mass spectrometer having single-ion sensitivity. However, the analyzing speed of this early APFIM technology was extremely slow, and only a miniscule fraction of the atoms comprising the specimen could be identified. The vast majority of field evaporated atoms were simply deposited without detection on the FIM phosphor screen.

Later in the 1970s with the introduction of more advanced microchannel plate (MCP) detectors, the 10-cm Atom Probe and Imaging Atom Probe (IAP) were developed by J. A. Panitz. This permitted many atoms to be analyzed simultaneously from a tip. A combination of APFIM and IAP eventually evolved into current APT methodology starting in the 1980s. Modern commercial instruments, using a modified configuration known as local-electrode atom probe (LEAP®) are capable of very high detection efficiency of specimen atoms, and can analyze close to $10^7$ cubic nanometers ($nm^3$) of tip material per day.

A schematic diagram of the operating principles of a prior art APT instrument 10 using a local-electrode configuration is shown in FIG. 1. FIG. 1 shows a specimen 12 cooled to cryogenic temperatures, typically 20-50° K at a high positive potential 14, typically 2-15 kilovolts (kV) from the ground. Tip 30 of specimen 12 is extremely sharp and created either through electrochemical etching or using a focused ion beam (FIB) instrument. It typically has a tip-radius of 20-100 nm. FIG. 1 of the prior art which is not drawn to scale for explanatory purposes also shows a local-electrode (or local electrode) 16 held at or near-ground potential 18 with respect to specimen 12.

Local-electrode 16 has a funnel shape, with a small opening aperture of several tens of microns. This aperture is positioned a comparable distance from specimen tip 30. The use of local-electrode 16 greatly reduces the voltage required for field evaporation due to enhanced field strength as a result of the small gap/distance between electrode 16 and tip 30.

Specifically, electrode 16 is pulsed slightly negatively with respect to its direct current (DC) near-ground potential 18 in sub-ns duration pulses so as to precisely control the release of ions from tip 30 by field evaporation. In FIG. 1, reference numeral 19 depicts a single square-wave pulse used for the above-mentioned slightly negative pulses for electrode 16.

Instead of using slightly negative pulses with respect to ground potential 18, pulsed laser focused on tip 30 may also be used to release ions under field evaporation. Such a laser pulse 24 is shown in FIG. 1. In such a scenario, local-electrode 16 is connected to a steady ground potential 18 to provide nearly the electric field threshold necessary for guiding the release of ions by field evaporation. Thus, under the influence of either a pulsed negative potential of local-electrode 16 or laser pulses 24, atoms on tip 30 of specimen 12 are ionized and released by field evaporation using these two alternate methods of pulsed field evaporation.

Two such ionized atoms 26 and 28 are shown in FIG. 1. The former is a copper $Cu^+$ ion and the latter an iron or $Fe^{++}$ ion, shown here being released from a representative sample alloy of iron and copper. Mode-locked solid-state lasers are typically employed for the above application, which can have pulse durations of under 1 picosecond (ps), and pulse rates in the hundreds of kilohertz (kHz). This can permit very precise timing of over a thousand field evaporated ions/second. Typically, operating parameters are adjusted so that single ions are created by only about 1% of pulses to avoid multiple ions being created in each individual pulse.

Ions 26 and 28 liberated from tip 30 of specimen 12 travel through local-electrode 16 near ground potential 18 and impinge on a particle detector. The particle detector shown in FIG. 1 comprises a microchannel plate (MCP) 20 that has a high enough gain to permit single particle sensitivity along with high spatial resolution due to its multiplicity of channels. The particle detector shown also includes a cross-delay line position sensitive detector 22. Ions impinging on microplate 20 produce many secondary electron emissions which are detected by cross-delay line position detector 22 for determining the spatial position of the MCP electron output emissions. Together, microplate 20 and detector 22 are able to provide the time-of-flight (TOF) measurements of incoming ions 26 and 28 as well as their spatial resolution (Xs, Ys) on detector 22. In some atom probe instruments, an ion optical system known as a "reflectron" is inserted into the flight path of the ions to increase transit time for achieving better mass resolution.

After collecting typically many millions of such individual emissions, sophisticated reconstruction software is used to reconstruct a three-dimensional (3-D) atomic-scale map of tip 30 of original sample 12 using the large data sets of field evaporated ions. The resultant full three-dimensional atomic-scale map of the tip can be manipulated for optimal viewing of material structure and composition at sub-nm spatial resolution. FIG. 2 shows a two-dimensional cross-sectional image 40 from such a 3-D atomic scale map of a reconstructed tip, such as tip 30 of specimen 12 of FIG. 1. More specifically, FIG. 2 shows a reconstructed tip that has undergone APT from a sample of a steel alloy, with manganese (Mn), nickel (Ni), and titanium (Ti) impurities, and published in NPL reference "Chemical gradients across phase boundaries between martensite and austenite in steel studied by atom probe tomography and simulation", by Dmitrieva et. al of Max-Planck Institute, Dusseldorf, Germany, dated October 2010.

Let us now discuss the mounting member of such a prior art APT instrument that is responsible for holding specimen 12 of FIG. 1. For a local-electrode APT configuration, such a mounting member is typically known as the "puck". Such a puck 60 of the prior art is shown in FIG. 3. More specifically, puck assembly 60 consists of a casing 62 and mount 64 typically made out of copper. At one end of the casing is a locking pin mechanism consisting of a mounting pin 68 and lock 70. A transfer arm/shuttle with a load-lock mechanism (not shown) is used to move the puck into the cryogenic and UHV analysis chamber and lock it in place with the help of mounting pin 68 and lock 70.

Casing 62 is also typically made out of copper to facilitate good thermal and electrical conduction with mount 64 containing specimen 12.

Electrical connection to specimen 12 as explained earlier in reference to FIG. 1 is provided by conduction through copper casing 62 and mount 64. Specimen 12 is locked into mount 64 by employing a set screw 66 shown. In other variations of APT the mounting member for the specimen may be different than this puck. Potential options include a structure resembling a "stub" used for mounting a sample in a scanning electron microscope (SEM). As will be explained in the summary and detailed description sections and the accompanying figures, the present design provides key innovations over specimen holding designs in general and puck 60 in particular of the prior art.

Previous APT Work with Biological Specimens

It has long been a dream of scientific community to extend field ion microscopy (FIM), and later atom probe tomography (APT) to biological samples for attaining atomic scale/resolution imaging of biological materials. Unfortunately, attempts to realize this have met with limited success due to a number of formidable technical challenges. Thus far, hard mineralized biological materials have been best suited for the technique. Difficulties with softer materials include both specimen preparation issues, as well as physical complications intrinsic to FIM and APT analysis of delicate and complex bio-samples.

The above complications include asymmetrical field evaporation from highly heterogeneous biological materials and extremely high and potentially destructive stress of the electrostatic field on the relatively fragile specimen tips during imaging and analysis. These complications further include the need to maintain the biological materials in a high vacuum as well as cryogenic environment. As a result, the goal of routine biological APT of biological specimens or bio-samples remains elusive.

Scientific instruments for determining the structure and composition of materials at the nanoscale are crucial in modern science and technology. Sales of these extremely sophisticated instruments are a multi-billion dollar industry. They are used for both basic research applications, as well as applied development of a vast array of commercial products. As compared to electron microscopy (EM), FIB, and x-ray analysis, APT is currently a much more specialized technique, with restricted application. This is due to the need to prepare samples into very fine specimen tips, and the limited types of materials that are usable with APT. The equipment is also extremely costly, which has limited the number of installed instruments.

The potential of APT to produce useful imaging of ultrastructure of biological materials could be a tremendous advancement to this form of imaging and chemical analysis. As with inorganic samples, APT holds the promise of atomic-scale images of biological samples, along with chemical identification. Such capability is not achievable with any existing technique known in the prior art. The present invention transforms biological APT to become an extremely valuable complementary tool, when used in conjunction with other techniques, such as transmission electron microscopy (TEM). In addition to biological materials, other soft materials such as polymers would also find useful application of the present technology.

Thus, the present invention is primarily but not exclusively directed to methods and apparatus for applying APT to biological materials and addresses shortcomings of the prior art in handling and analyzing soft materials. As will be taught, the instant inventive approach includes producing tip structures that differ from those fabricated using focused ion beam (FIB) techniques of the prior art. The instant tip structures facilitate stable field evaporation in a manner akin to that observed with inorganic materials and thus provides accurate reconstruction of large specimen volumes without tip failure. The instant techniques are also less time-consuming and less costly to implement than the fabrication techniques of the prior art. Both polymer-embedded and frozen-hydrated material may be applicable for use with the instant techniques.

The benefits of the capabilities of APT for biological applications would also have positive ramifications for many areas of life science. Both basic research in the life sciences, as well as medical applications stands to benefit. This will greatly increase the use of APT, and increase the commercial potential of these sophisticated instruments. With higher demand, the cost of these instruments could also significantly decrease. At present, the restricted types of materials applicable to the technique and high cost of the instruments have limited the total commercial market to approximately 100 atom-probe instruments of all kinds worldwide. Expanding APT into the biological realm could greatly increase the use and commercial sales of these instruments.

OBJECTS OF THE INVENTION

In view of the shortcomings and unfulfilled needs of the prior art, it is an object of the present invention to provide a set of techniques for extending APT technology to biological specimens.

It is also an object of the invention to extend APT technology to other softer and mechanically fragile materials, such as polymers, that cannot withstand the stresses of the present APT instruments. Techniques of the invention are also directed to applying APT to more conventional inorganic samples, without relying on FIB-based specimen preparation.

It is further an object of the invention to provide mechanisms for stabilizing biological and soft materials for APT in general and for local-electrode APT in particular.

It is further an object of the invention to increase the installed based of APT instruments by adapting them to medical and life sciences industries.

It is still another object of the invention to reduce the cost of APT instruments that presently suffer from a limited number of compatible applications.

These as well as other objects of the invention will be evident in the forthcoming summary and detailed description sections of this disclosure.

SUMMARY OF THE INVENTION

The objects and advantages of the invention are secured by methods and apparatus of stabilizing soft specimens for analysis by an atom probe tomography (APT) instrument. The soft specimens may be biological samples or any other soft/fragile materials, including polymers, that are unable to withstand the stress of the electrostatic field of an APT instrument. The present techniques are also applicable to more conventional and rigid/hard specimen materials.

According to the present design, the soft specimen is surrounded by a rigid/hard protective structure with supporting walls and composed of a material that is able to withstand the stress of the APT environment. Only the very end or a nanoscale terminus of the specimen material is exposed to the electrostatic field stress of the APT instrument, and under the influence of which field evaporation of ions from the terminus occurs.

The ions are analyzed by the APT instrument to reconstruct a three-dimensional atomic-scale or molecular-level map of the terminus of the specimen. The present techniques extend the benefits of traditional APT technology to soft specimens, that have been heretofore subject to disintegration in the harsh APT environment. The harshness of the APT environment is mainly due to the stress of the electrostatic field of APT but also due to cryogenic temperatures and ultrahigh vacuum (UHV) conditions required for APT.

In the preferred embodiment, the APT instrument is a local-electrode APT instrument and the electrostatic stress is due to the high electric field resulting from the voltage applied between the sharp sample/specimen tip and nearby local-electrode. In the same or another embodiment, the nanoscale terminus of the specimen has a quasi-spherical or quasi-hemispherical shape with a radius in the range of 10 nm to 200 nm. Advantageously, the specimen analyzed by the APT based on instant design, is composed of a soft material, and preferably a bio-sample. Otherwise, it may also be composed of a rigid/hard or more traditional material.

In another preferred embodiment, the protective structure used to stabilize the soft specimen takes the form of a nanoscale conical grinder/cutter. A conical preform is grinded/ground/cut by the conical grinder/cutter to produce an "APT-ready" nanoscale terminus of the specimen in-situ. This way, the specimen can be continually consumed under field evaporation of APT and replenished in-situ by machining of the tip of the specimen to regenerate the nanoscale terminus in-situ. Such an embodiment is also referred to herein as an atom probe nano-lathe (APNL).

Preferably, the nanoscale conical grinder/cutter acting as the protective structure of the current design is composed of diamond because of its superior and durable strength. Preferably the nanoscale diamond grinder/cutter is fabricated from a conical diamond stylus. Still preferably, the nanoscale conical diamond grinder is fabricated by depositing thin films of diamond, or another suitably hard material, onto a nanoscale mold. The mold may be conical, pyramid-shaped, triangular, hexagonal or of any other suitable shape and may be raised onto or depressed into a substrate that is preferably composed of silicon. Preferably, a cantilever support for the nanoscale protective structure/grinder is also monolithically deposited alongside it by the deposition process.

In a highly preferred embodiment, the protective structure in the form a nanoscale conical grinder/cutter is integrated into the "puck" of a local-electrode APT instrument. The puck is then transferred into the analysis chamber of the APT instrument under a load-lock mechanism where the terminus of its specimen can be analyzed by APT. The transfer is carried out by a transfer arm or shuttle mechanism.

The above-described machining of the specimen is carried out by a grinding/cutting function of the soft specimen, performed by rotating the specimen with respect to the nanoscale conical grinder. The rotation is preferably performed by a rotary drive or motor that rotates the specimen as well as laterally pushes or feeds it out towards the conical grinder/cutter thus reforming the terminus as it gets consumed. In an alternative embodiment, the specimen stays stationary while the nanoscale conical grinder is rotated around its tip. In any case, the rotary drive or motor is also preferably integrated into the puck.

Preferably, the motor is powered wirelessly from outside of the APT instrument using techniques including an external light source and photovoltaic cell(s), inductive coupling, etc. This is to eliminate the need for motor power leads. In another highly preferred embodiment, the motor is a completely self-contained compact mechanical device, much like a mechanical watch movement. This eliminates the need for providing a continuous external power source. In such an embodiment, the energy source of the movement (typically referred to as the mainspring) is wound externally and then the puck is placed and locked in the analysis chamber of the APT instrument before commencing operation.

In another preferred embodiment, vents are milled through the walls of the conical grinder which facilitate the grinding/cutting action as well as allow the exit of the cut debris or chips. The vents also act as fiducial markers while milling the interior cone of the grinder/cutter by keeping it coaxial with the exterior cone. The vents are preferably circular or triangular and are arranged 90° apart on the cone axis. However, the present scope covers any number and shape of vents. In a variation, the nanoscale conical grinder is fabricated from a glass nanopipette or nanotube.

In another highly preferred set of embodiments the protective structure is a nanopipette/nanotube in which the specimen or sample is first frozen before analyzing it in the APT instrument.

In such a design, the specimen is first pipetted/sucked into the nanopipette and is frozen in the cryogenic environment of the APT instrument. The exposed nanoscale terminus of the specimen as well as the tip of the nanopipette then undergo field evaporation together. The liberated ions are then analyzed to reconstruct a three-dimensional image of the terminus as well as the nanopipette/nanotube tip.

In the present embodiments, the field evaporation of the specimen terminus as well as the nanopipette tip are necessary. This is because unlike the embodiments of APNL above, there is no force that is driving the specimen out of the nanopipette and continually exposing it in the analysis chamber of the APT instrument. Advantageously, the nanopipette or nanotube is a made out of carbon. This is because such a nanopipette/nanotube is extremely sturdy and durable, thus allowing an extremely sharp and long nanoscale tip to be constructed that can be consumed for long durations under field evaporation. Preferably, the nanopipette is used to extract bio-samples from a single cell for APT analysis in the present embodiments.

Clearly, the system and methods of the invention find many advantageous embodiments. The details of the invention, including its preferred embodiments, are presented in the below detailed description with reference to the appended drawing figures.

BRIEF DESCRIPTION OF THE DRAWING FIGURES

Figure 6A:
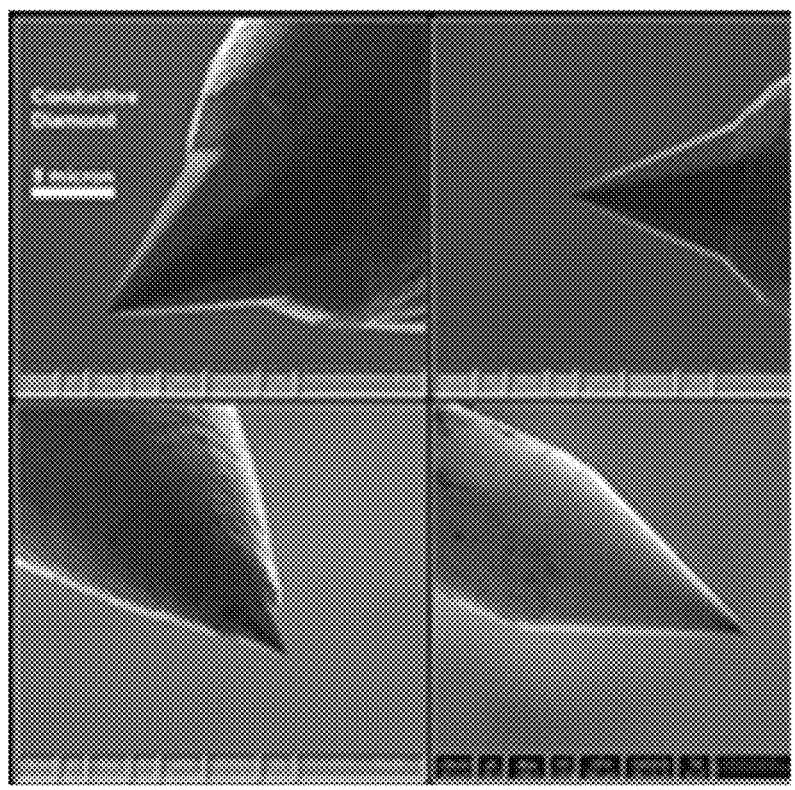
Figure 6B:
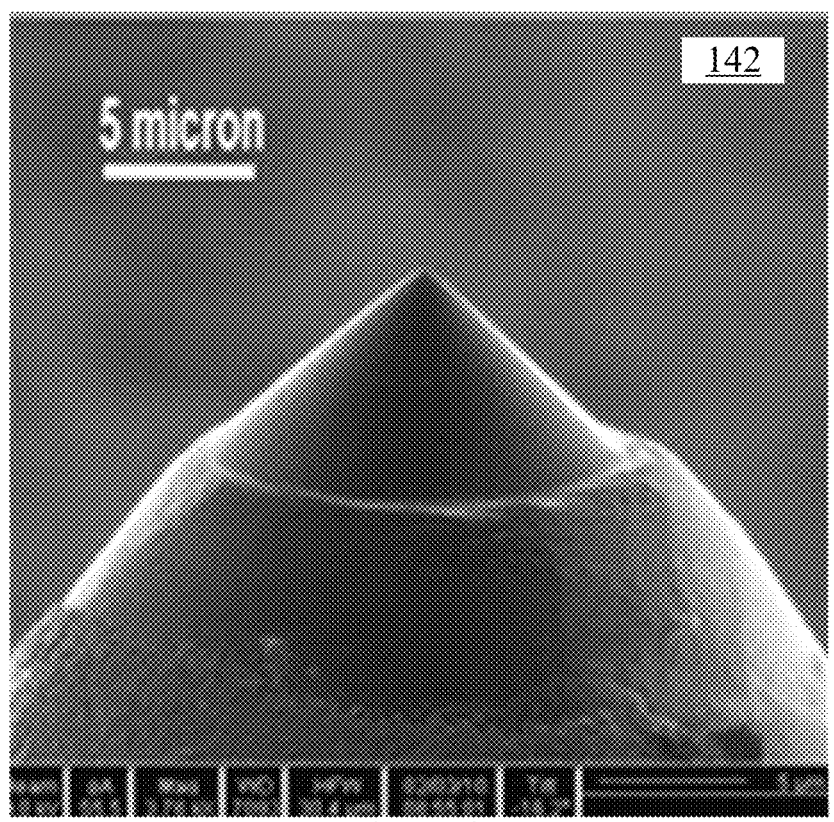

FIG. 6A-B are micrograph images of exemplary singlecrystal diamond styli suitable for fabricating instant protective/grinding structure/tool.

Figure 4A:
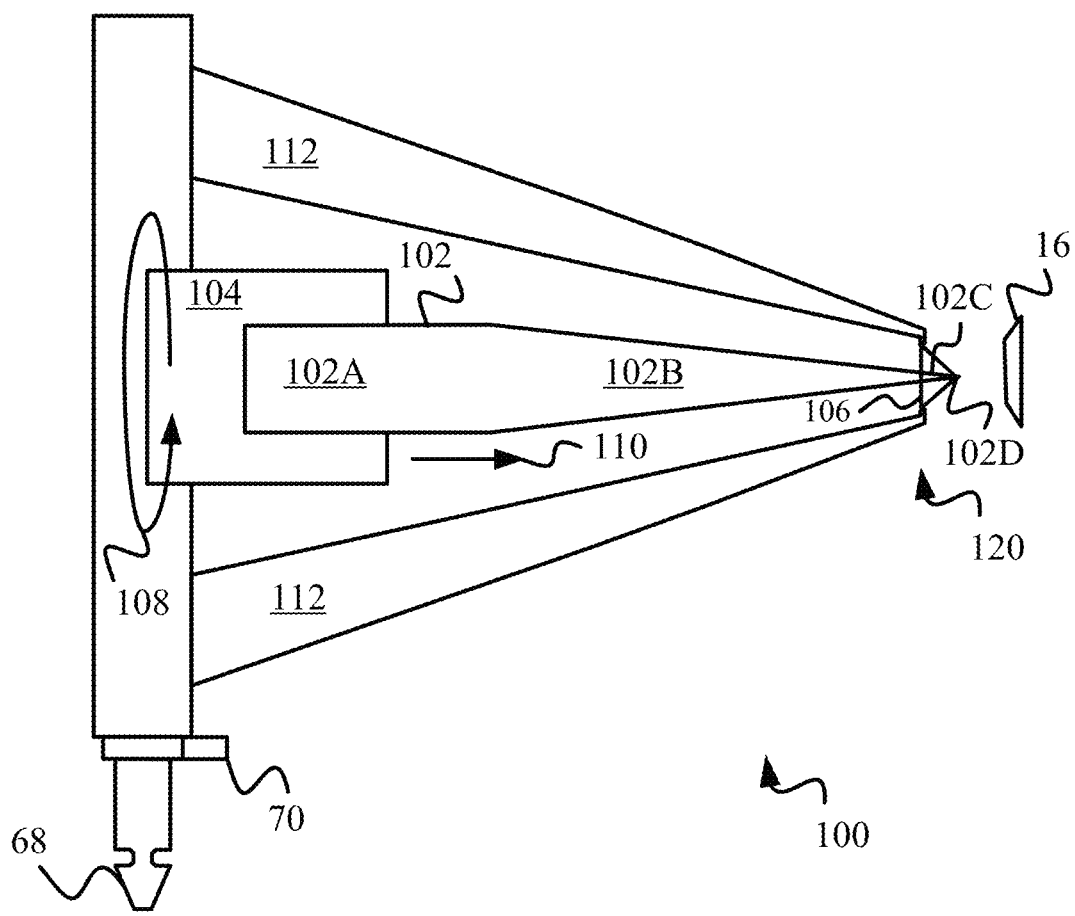
FIG. 4A shows an atom probe nano-lathe (APNL) assembly based on the present design.
Figure 4B:
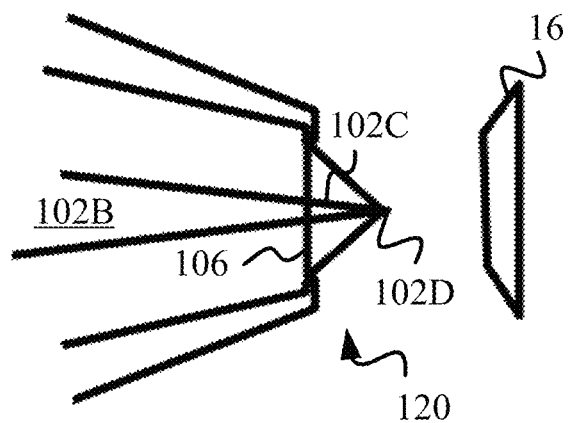
FIG. 4B shows a sub-assembly from FIG. 4A in an enlarged view detailing the design of the protective/cutting structure/cone/tool based on the instant principles.
Figure 5:
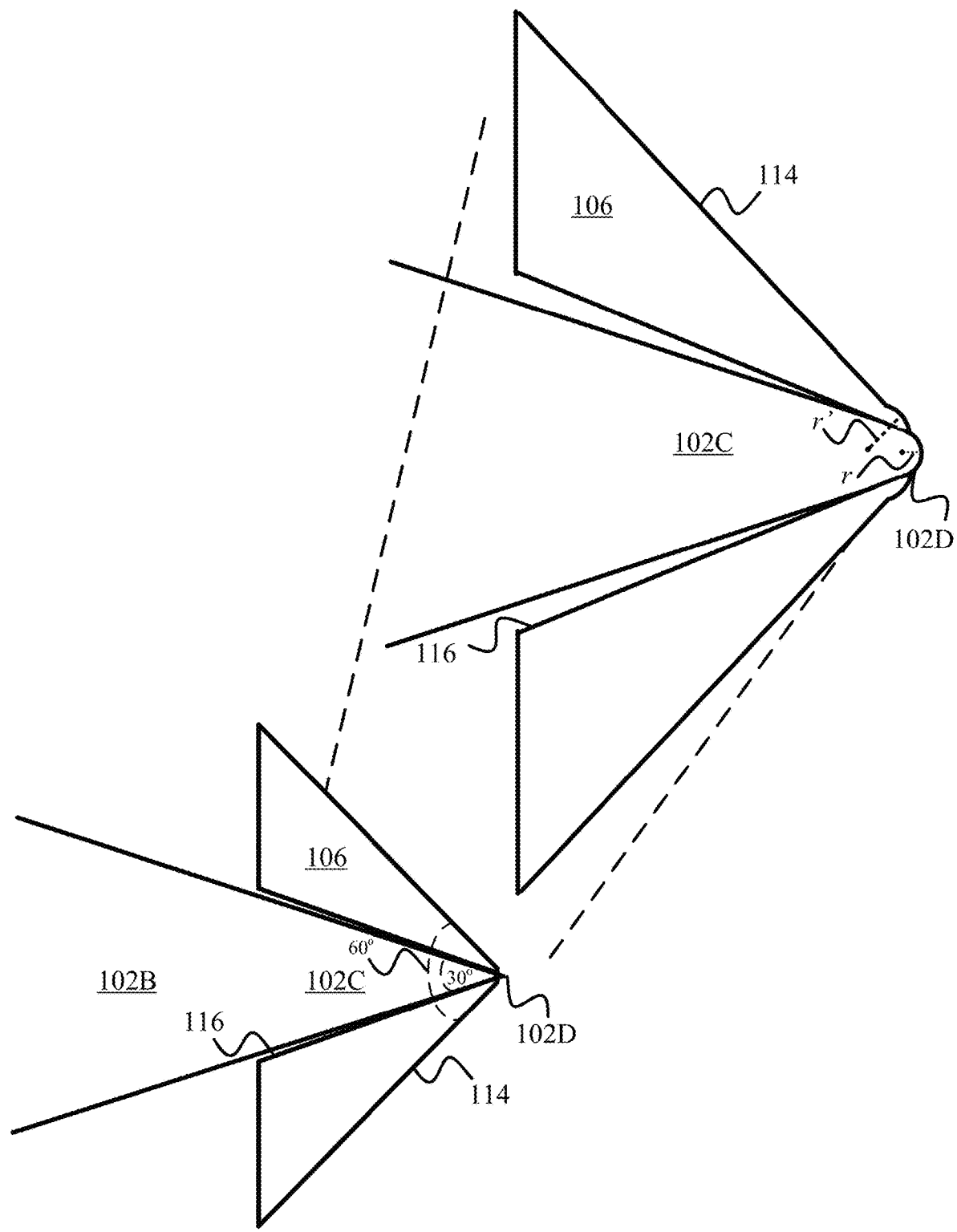
FIG. 5 is a detailed view of the right-hand side portion of FIG. 4A-B showing the opening-angles of the interior and exterior cones of the instant protective/cutting structure/ cone/tool. Also shown in an exploded view the semi-spherical terminus of the specimen with a nominal radius of r enclosed in a semi-spherical end of the tool with a nominal radius of r'.
Figure 7:
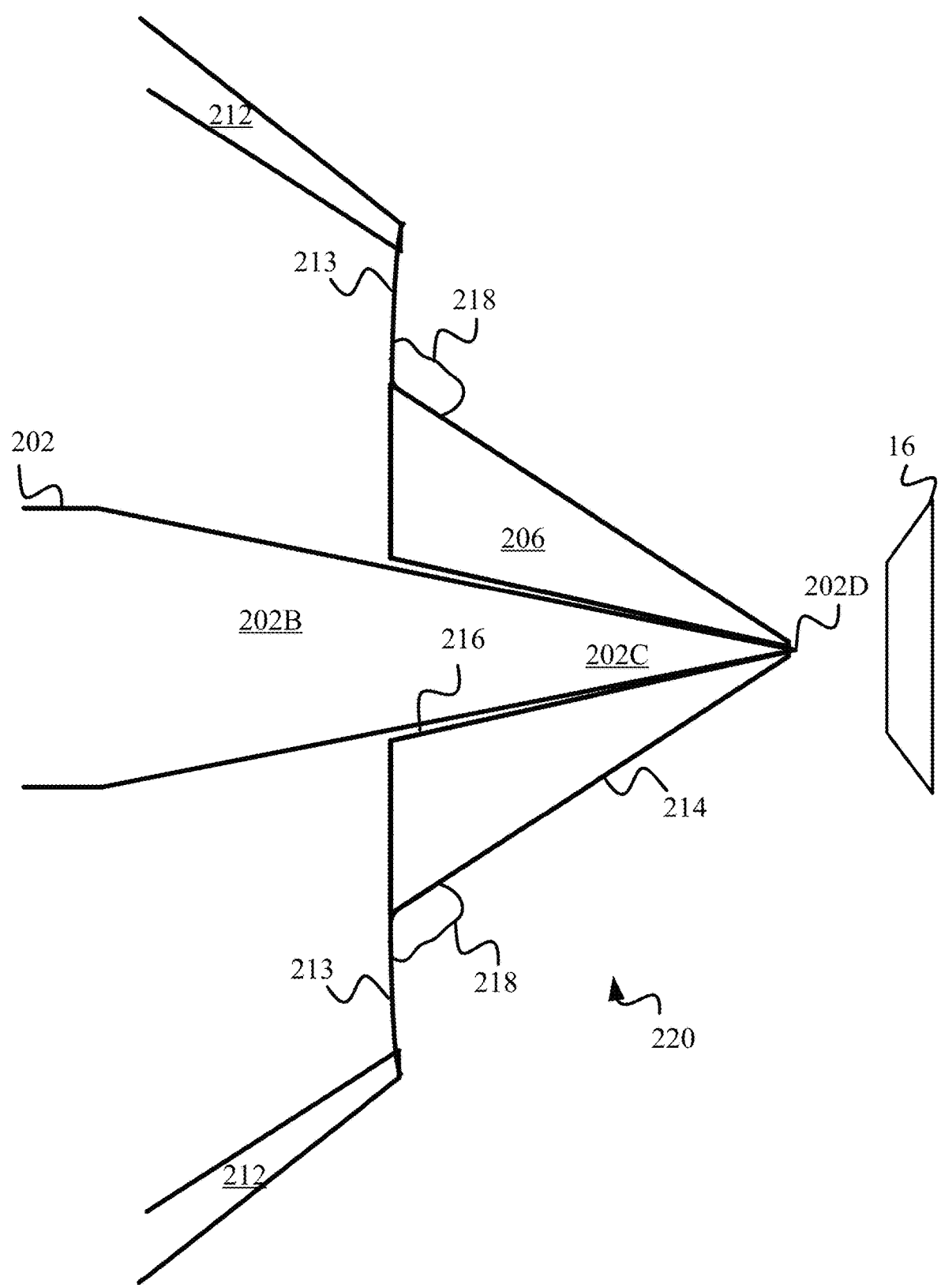

FIG. 7 is a detailed cross-sectional view of a sub-assembly of a protective/cutting structure/cone/tool and associated elements of an instant APNL design presented in the embodiments of FIG. 4A-B and FIG. 5.

Figure 8:
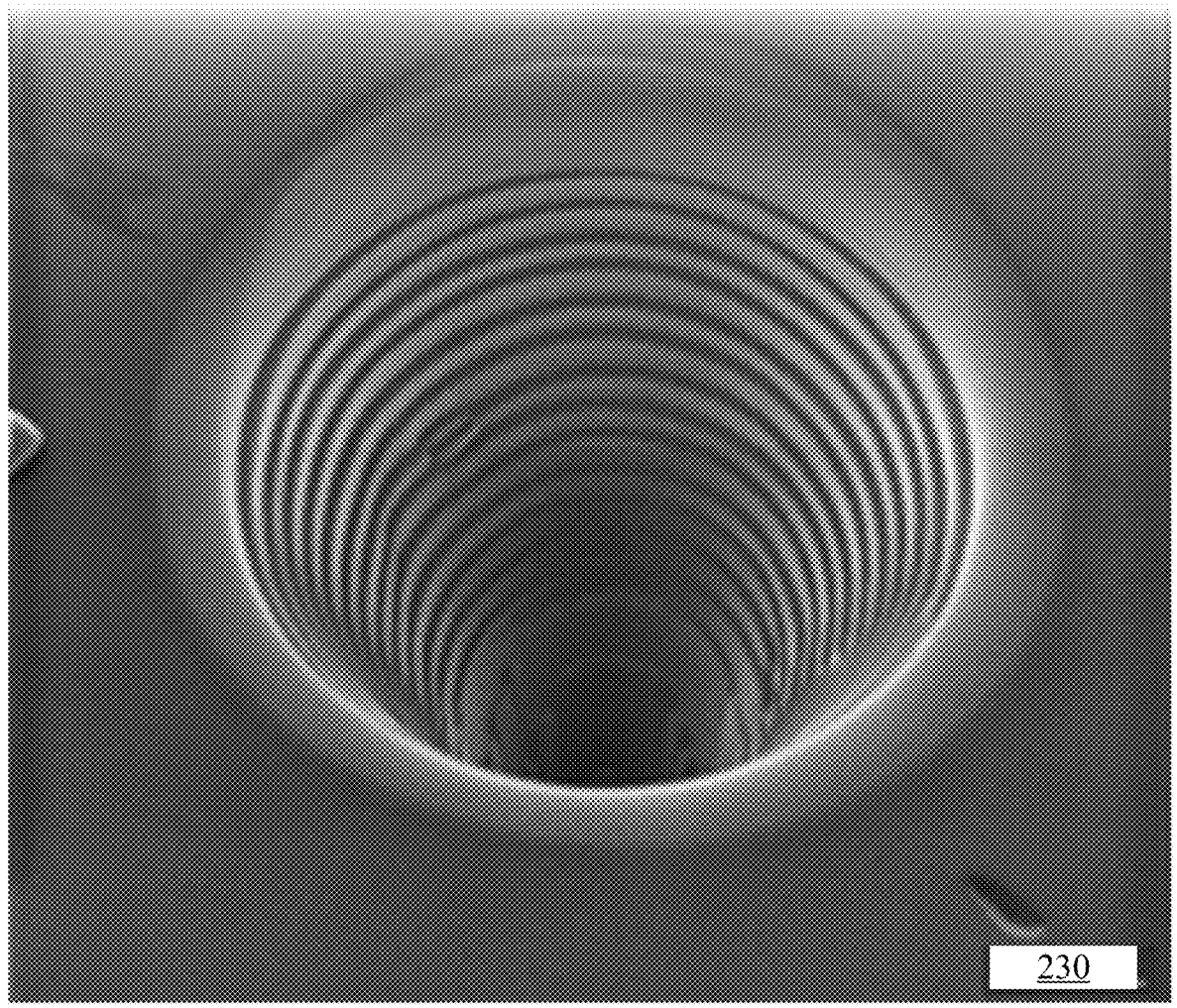

FIG. 8 is a scanning electron microscope (SEM) micrograph of an FIB-milled diamond (extrusion) wire-die, representative of the milling of the interior cone of the instant protective structure/grinding tool.

Figure 9:
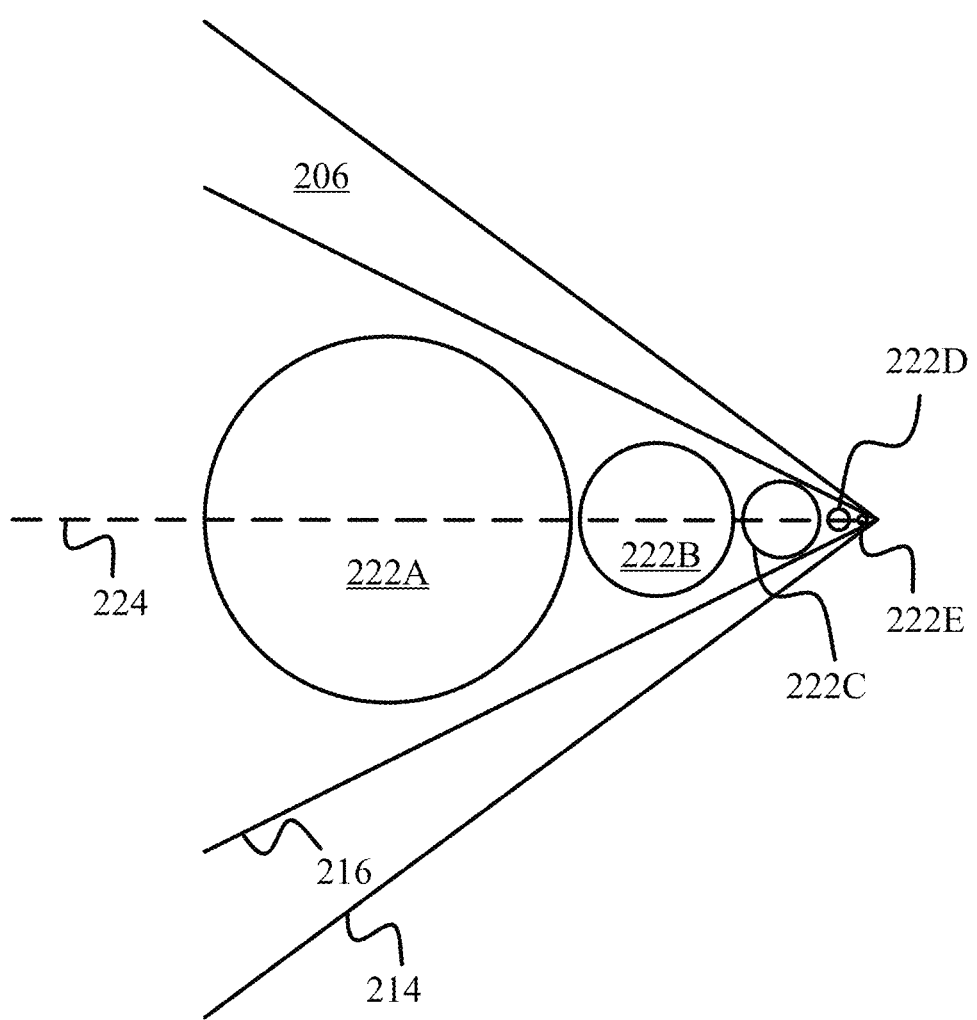

FIG. 9 shows a top or side view of a portion of the exterior and interior cones of an instant protective structure/grinding tool with circular alignment holes or vents.

Figure 10:
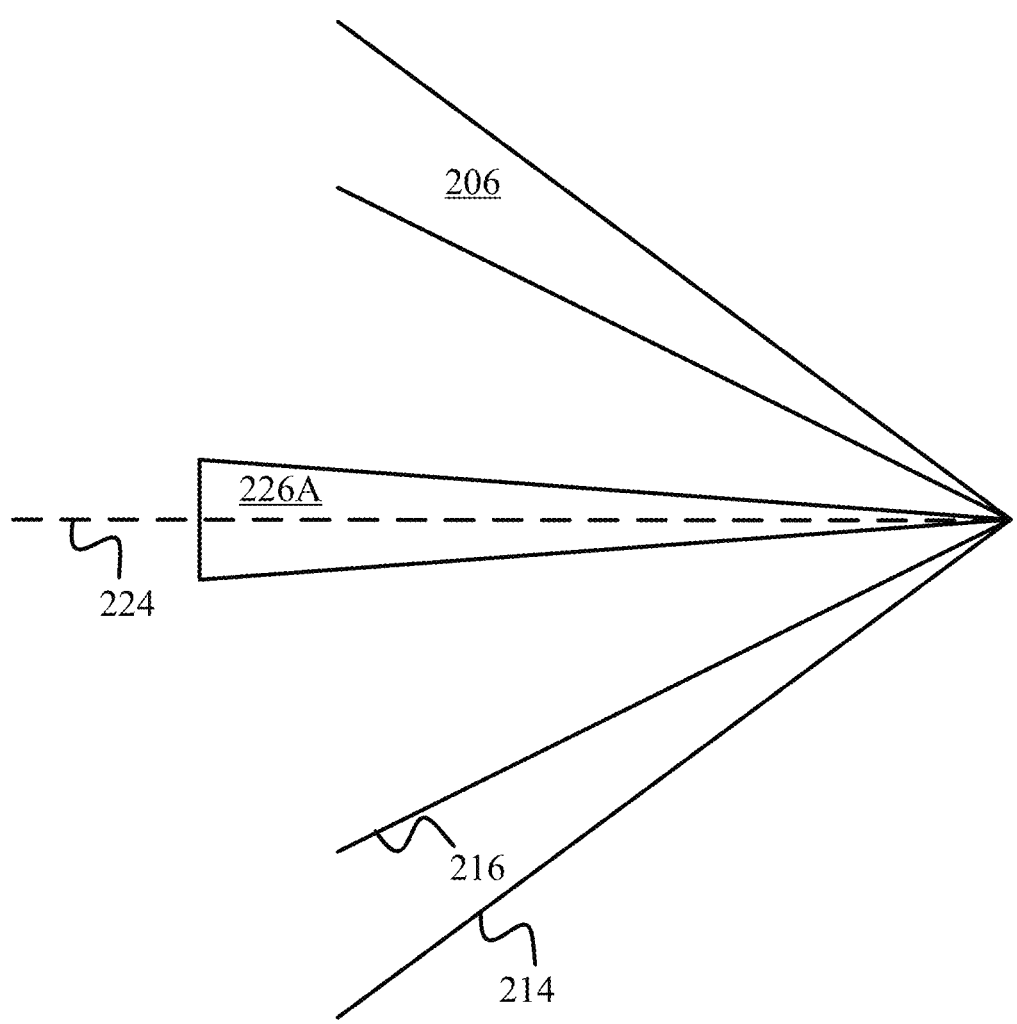

FIG. 10 is a variation of FIG. 9 where vents are triangular or tapered in shape. One such vent is shown in FIG. 10.

Figure 11A:
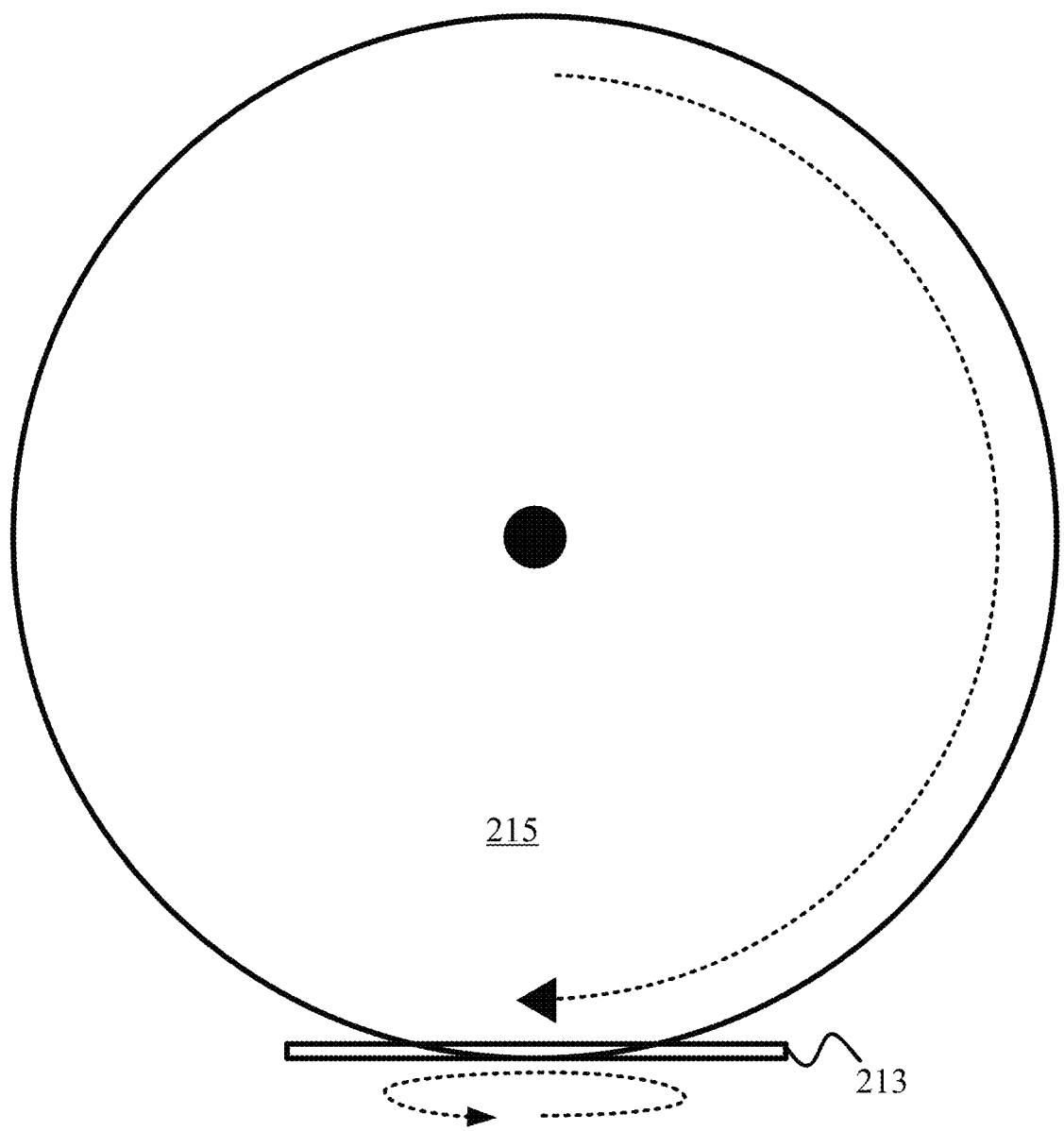

FIG. 11A shows a conceptual diagram of the grinding disk of a dimple grinder rotating and grinding a rotating substrate disk of the instant design.

Figure 11B:
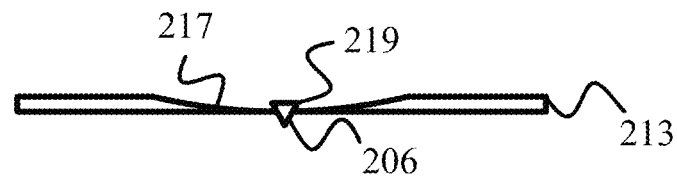

FIG. 11B shows the dimple in the substrate disk of FIG. 11A that is produced as a result of the dimple grinding action and a diamond stylus that has been inserted through a central hole and fabricated into a hollow protective/grinding tool based on instant principles.

Figure 12A:
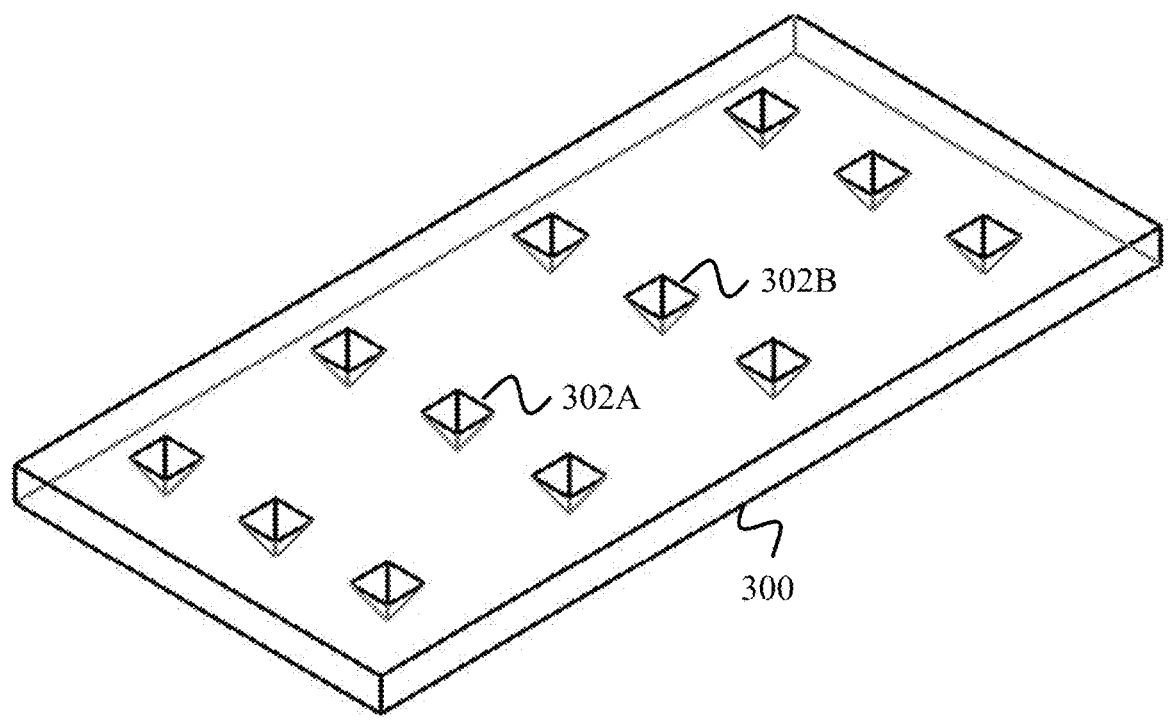

FIG. 12A shows such an exemplary silicon substrate with pyramid-shaped pits/depressions that act as molds for forming the instant nanoscale hollow protective structures/cones by thin-film or vapor deposition.

Figure 12B:
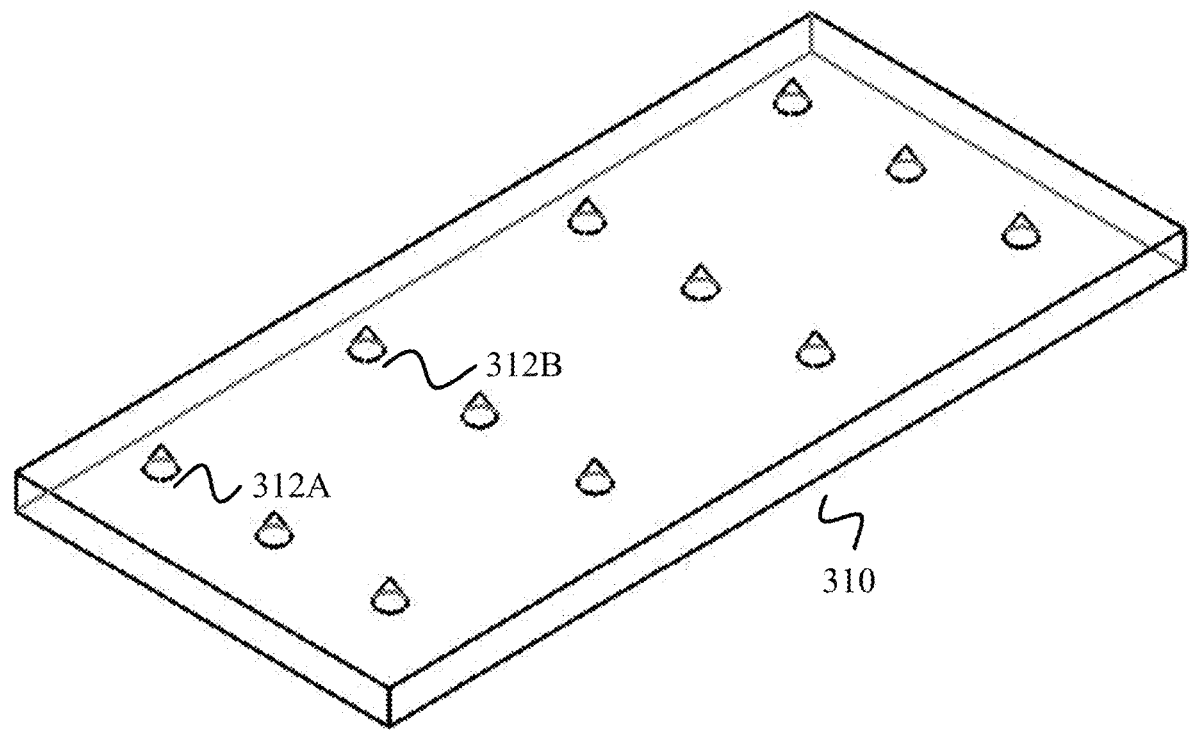

FIG. 12B is a variation of FIG. 12A where conical raised protrusions or projections are used as molds for forming the instant nanoscale hollow protective structures/cones by thinfilm or vapor deposition.

Figure 13A:
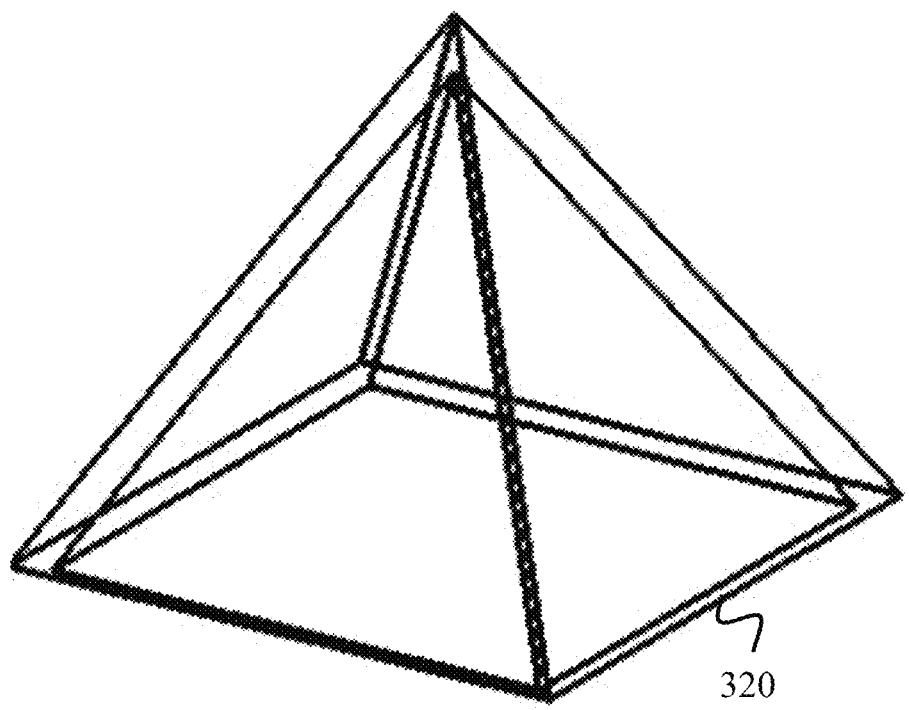

FIG. 13A shows an instant pyramid-shaped hollow protective structure resulting from thin film deposition of diamond or another suitably hard material onto a pyramidshaped mold. Unlike the embodiments shown in FIG. 4A-B, FIG. 5 and FIG. 7, the hollow protective structure has either un-tapered or substantially un-tapered walls. The structure is illustrated before the formation of a central hole or aperture at the pyramid apex for the passage of nano-machined sample material to the pyramid exterior for field evaporation.

Figure 13B:
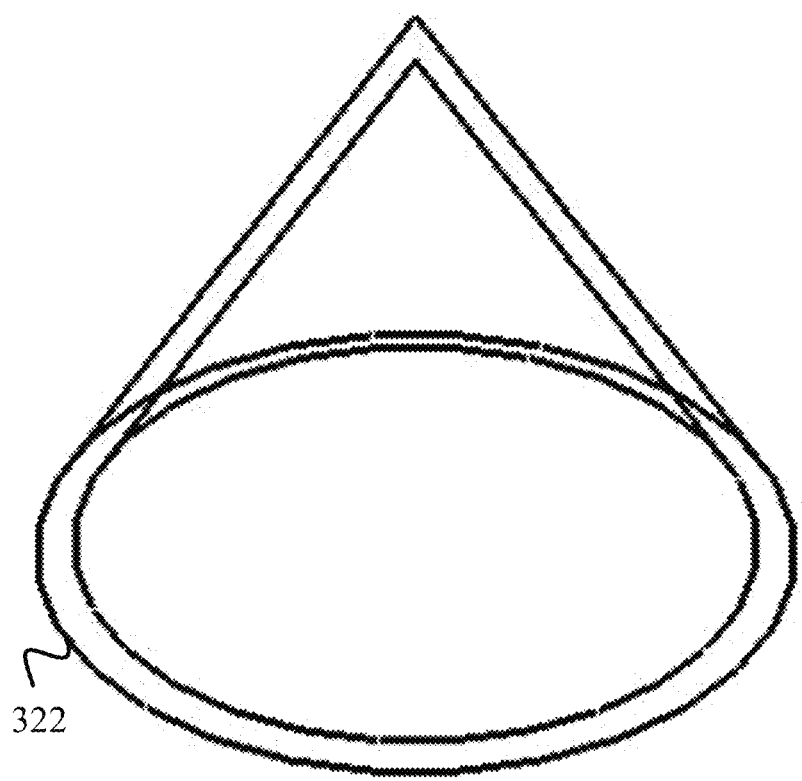

FIG. 13B is a variation of the protective structure of FIG. 13A having a conical instead of a pyramid shape. As in FIG. 13A, the central hole/aperture at the apex has not yet been fabricated.

Figure 14A:
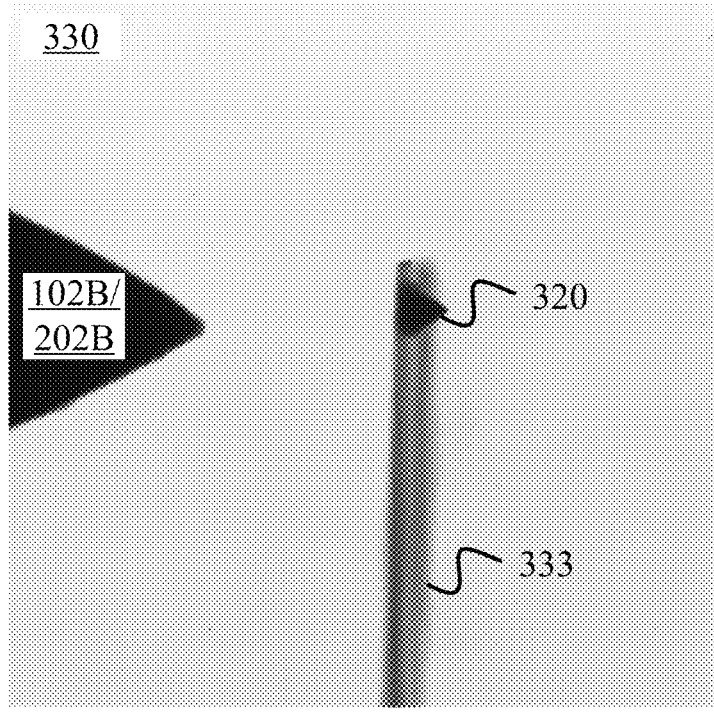
Figure 14B:
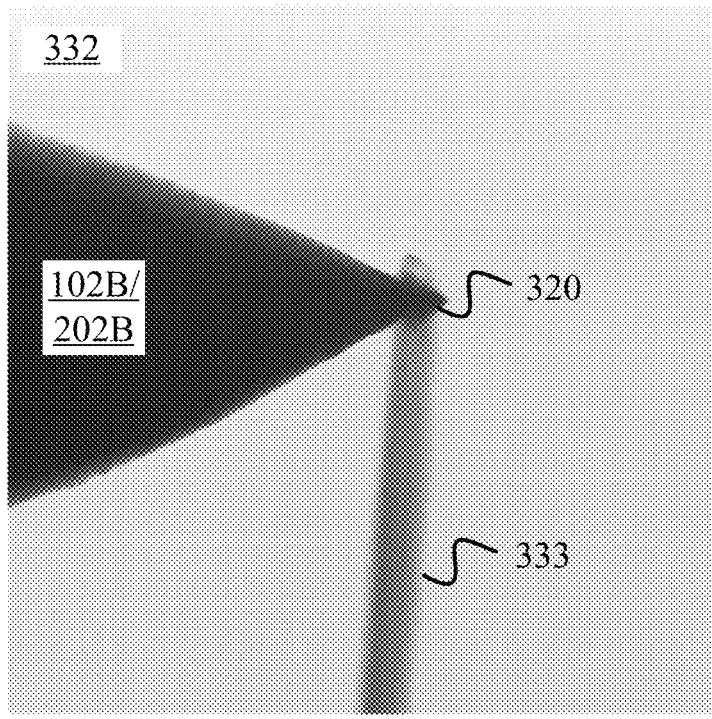

FIG. 14A-B are micrograph images of a conical preform of a soft specimen being inserted into an instant protective/ grinding structure/cone/tool produced with a vertical cantilever support.

Figure 14C:
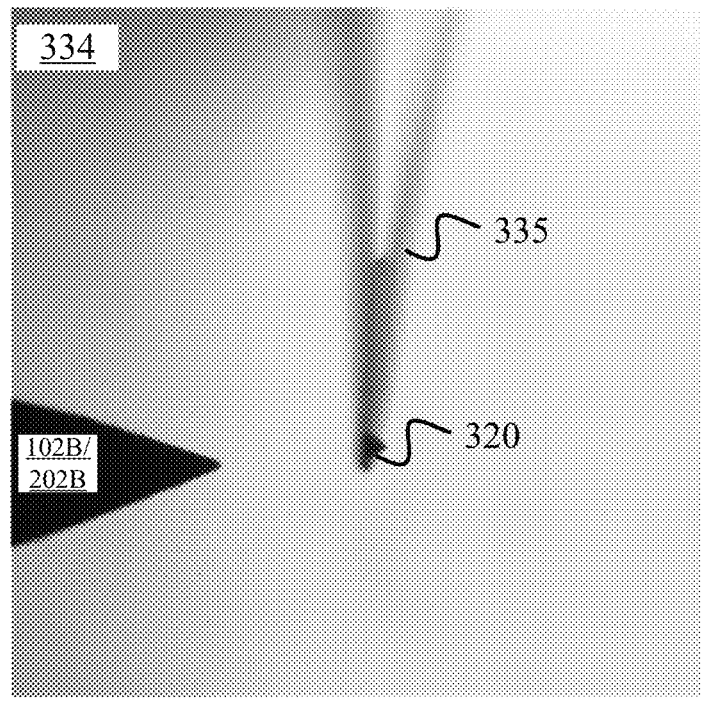
Figure 14D:
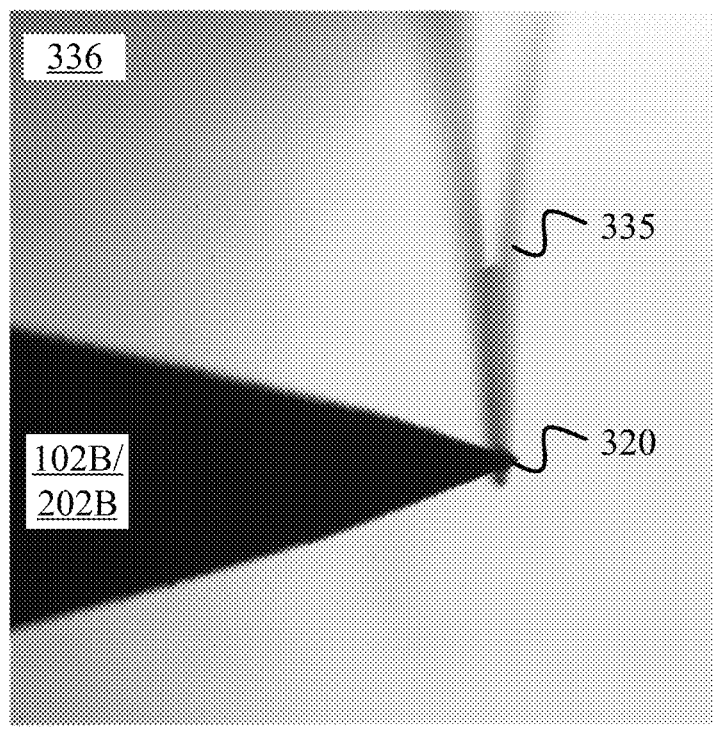

FIG. 14C-D are variations of FIG. 14A-B where the cantilever support is triangular in shape.

Figure 14E:
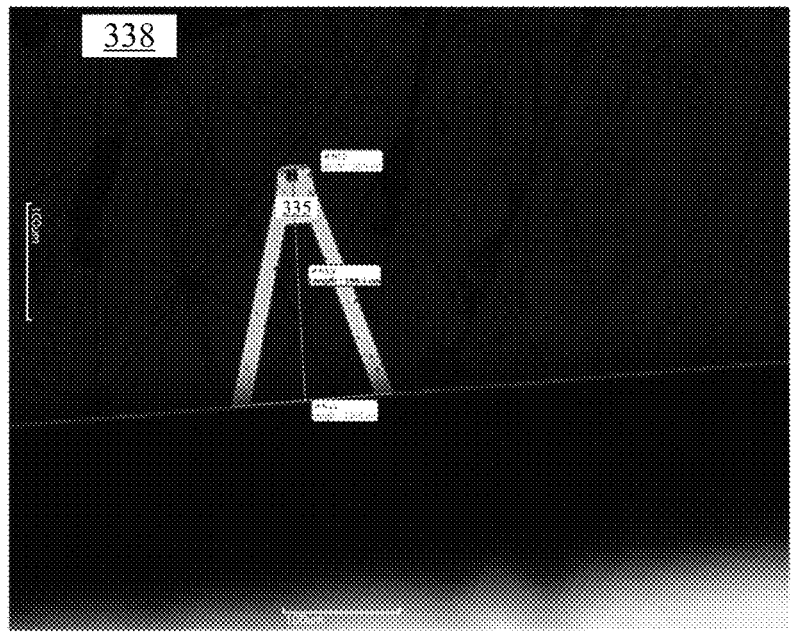

FIG. 14E is a low magnification image of the cantilever support of the variations of FIG. 14C-D.

Figure 14F:
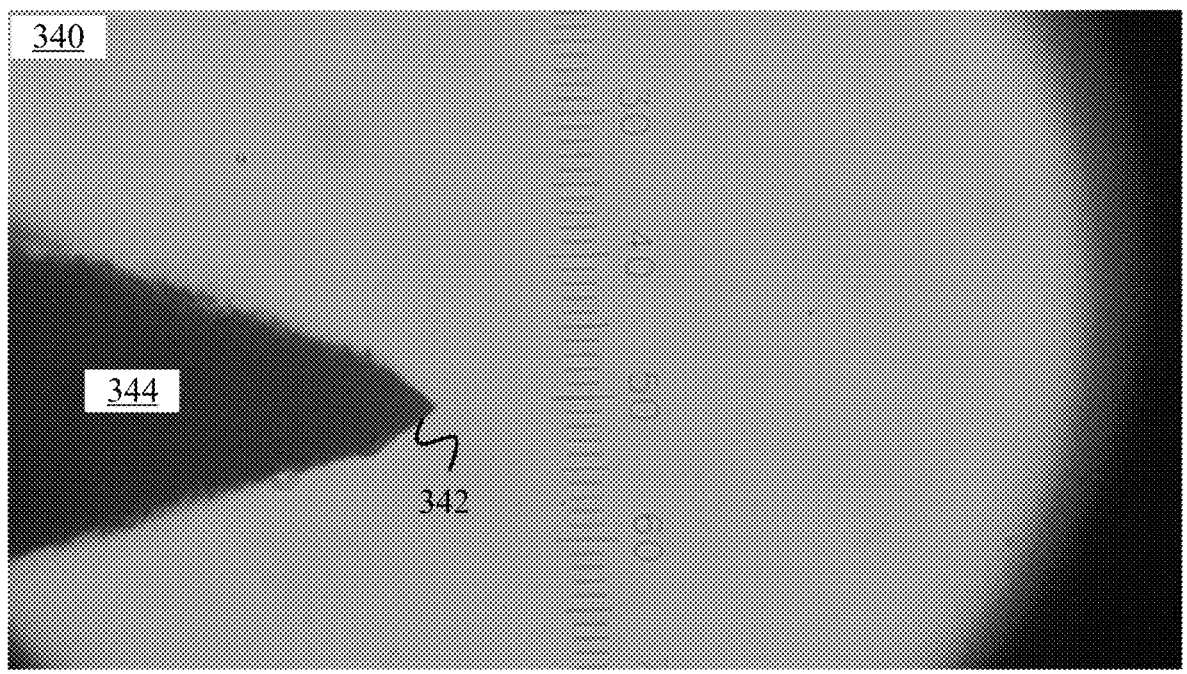

FIG. 14F shows a high magnification micrograph of a nicely coned micromachined tip of a specimen after being sharpened and smoothed by the inside surface of an instant protective structure cutter/tool.

Figure 15:
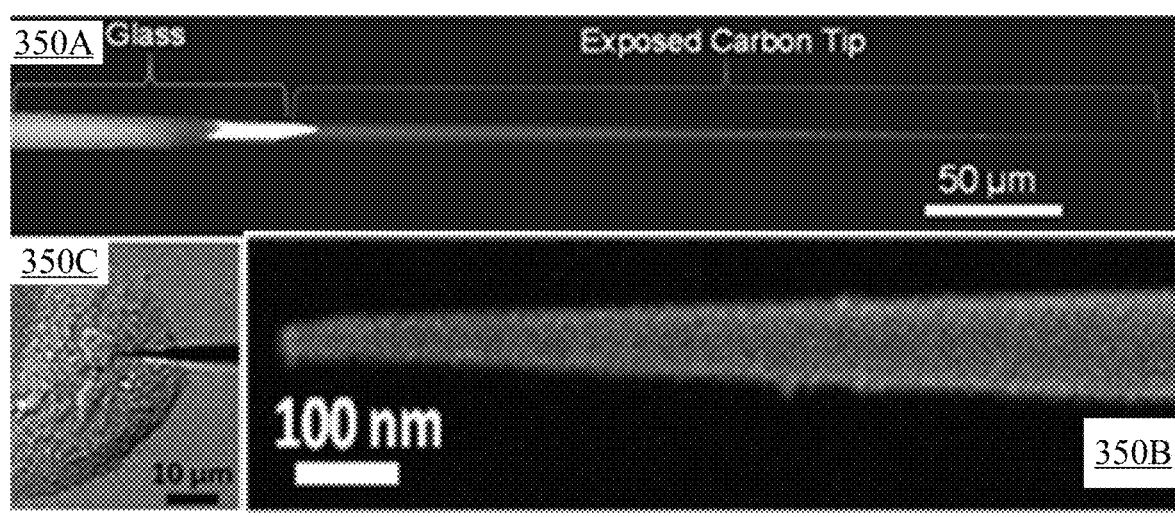

FIG. 15 shows micrograph images of an exemplary carbon nanopipette or nanotube that is used in a highly preferred embodiment as the protective structure. The figure also shows a micrograph image of a biological sample from a single cell being extracted into the nanopipette of the present embodiments.

DETAILED DESCRIPTION

The figures and the following description relate to preferred embodiments of the present invention by way of illustration only. It should be noted that from the following discussion, alternative embodiments of the structures and methods disclosed herein will be readily recognized as viable alternatives that may be employed without departing from the principles of the claimed invention.

Reference will now be made in detail to several embodiments of the present invention(s), examples of which are illustrated in the accompanying figures. It is noted that wherever practicable, similar or like reference numbers may be used in the figures and may indicate similar or like functionality. The figures depict embodiments of the present invention for purposes of illustration only. One skilled in the art will readily recognize from the following description that alternative embodiments of the structures and methods illustrated herein may be employed without departing from the principles of the invention described herein.

The system and methods of the present invention will be best understood by first reviewing the apparatus and associated methods for atom probe tomography (APT) of biological materials according to the present design. The instant design brings a key innovation to APT that radically differs from standard APT methodology. Specifically, rather than producing an extremely sharp finished specimen beforehand and transferring into the APT instrument, the present design continually produces the very end or terminus of the specimen tip for APT analysis in-situ. This regeneration of the nanoscale terminus can be performed continually as the terminus is consumed under field evaporation in the APT instrument.

Figure 1:
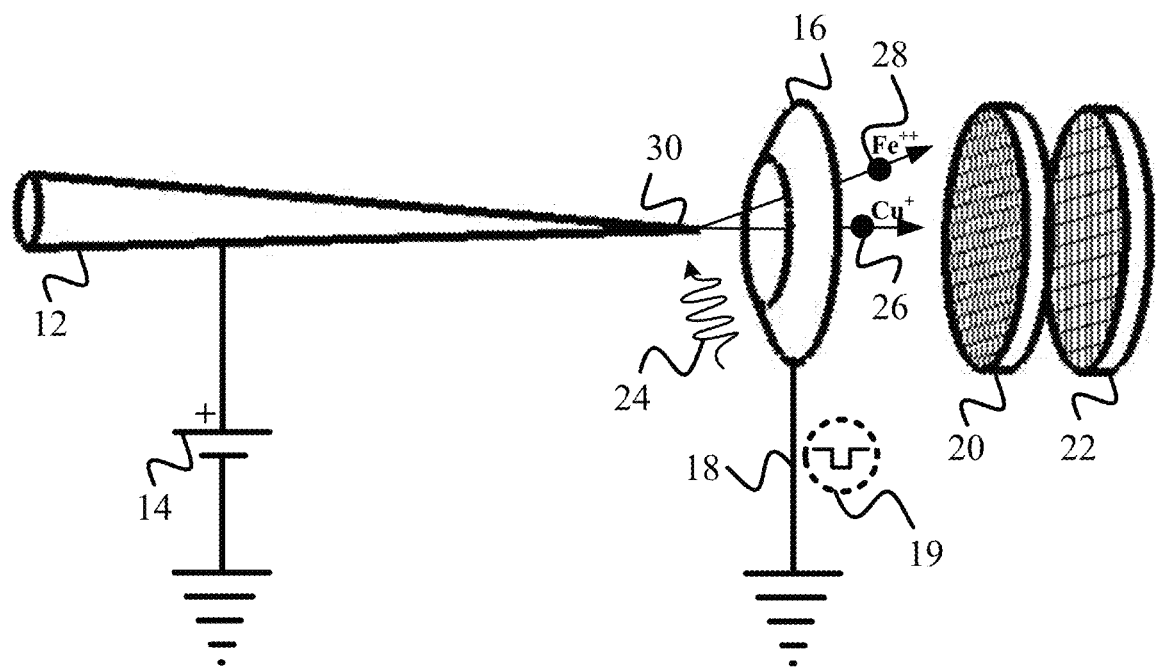
FIG. 1 illustrates a schematic diagram of the operating principles of a prior art local-electrode APT instrument.
Figure 2:
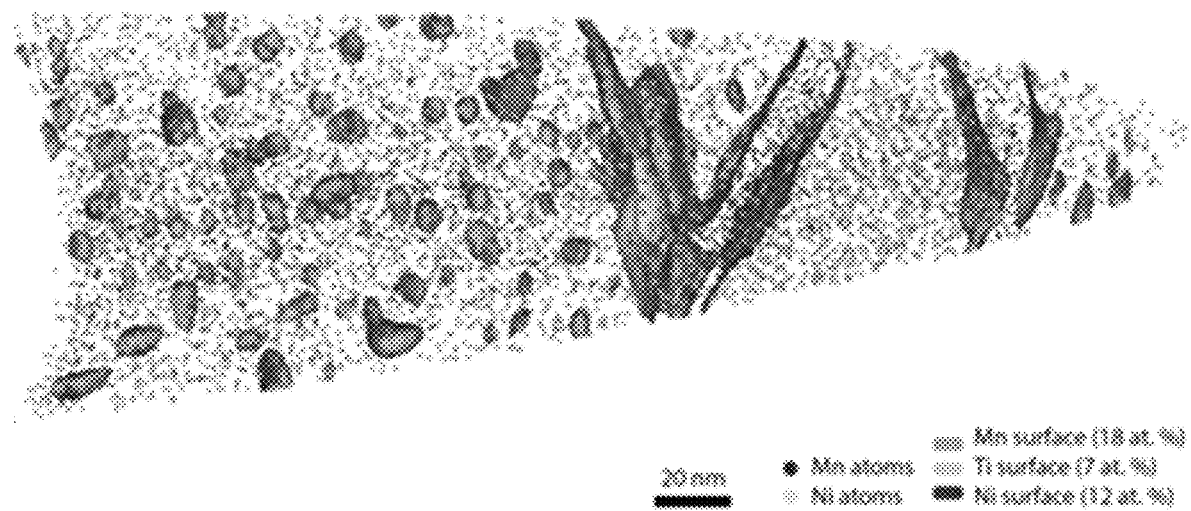
FIG. 2 shows a representative example of a two-dimensional cross-section of the reconstructed three-dimensional atomic-scale map of a prior art specimen tip.

According to the instant principles, the biological or any other fragile or soft material analyzed by APT is stabilized by surrounding or enclosing it by a rigid protective structure with walls. The only specimen material that is exposed to the APT environment is the very end or terminus of the tip of the specimen. The enclosing walls support the specimen which has the needle-like shape of a typical APT specimen as explained in the background section and FIG. 1-3.

However, in a typical APT arrangement, the specimen is machined and/or prefabricated beforehand into an extremely sharp nanoscale "APT-ready" tip that is suitable for APT. Such a machining/fabrication process is problematic for fragile or soft materials such as bio-samples as they are subject to disintegration and ion damage during FIB machining. FIB specimen preparation is also time consuming and requires costly equipment. Additionally, the electrochemical etching process used to make typical APT specimens from hard materials, is also unsuitable for bio-samples because they are insulators.

In contrast, in the present design the specimens only need initially to have a somewhat pointed conical preform, with an end diameter or radius measured in microns. The blunt/rough/approximate conical preform is then regularly machined into a finer tip with an APT-ready nanoscale terminus in-situ during operation. This avoids the repeated costs of an extremely sharp nanoscale APT-ready tip preparation of the prior art each time analysis needs to be performed. As will be explained, that the somewhat pointed specimen having a rough conical preform is then grinded (or ground) in-situ on a continual or as-needed basis to produce the very sharp nanoscale terminus that is required for APT.

Further in contrast, in a typical prior art APT instrument, the entire or most of the needle-like specimen is exposed to the stress of the electrostatic field in the cryogenic and ultrahigh vacuum (UHV) environment of the APT. This stress often results in mechanic fracture and failure of the specimen, even composed of strong materials. In contrast, the present design mechanically protects or surrounds, or in other words stabilizes, almost the entire conical end of the specimen by enclosing it in a protective/protecting structure. The design then only exposes the very end of its tip to the stress of the electrostatic field in the analysis chamber or the interior of the APT environment. The very end of the tip is exposed to pulsed electric field or pulsed lasers under the influence of which field evaporation of ions from the specimen occurs per explanation of the workings of APT in the background section.

It should be understood that the methods and apparatus of the present design are directed to stabilizing the softer specimens, including bio-samples, for analysis in the harsh environment of the APT. As such, they are agnostic of the particular design and configuration of the APT instrument being used. Since a local-electrode APT configuration is commonplace, it is used as an exemplary implementation to facilitate explanation, while noting that the present principles can be easily extended to other APT designs by those skilled in the art. The present techniques thus extend the benefits of APT to soft specimen, including bio-samples. The end result is the production of a detailed three-dimensional atomic-scale or molecular-level map/structure of the nanoscale terminus of the soft specimen, as customarily only possible for rigid/hard specimens of the prior art.

In the preferred embodiment, the protecting or protective structure for the specimen is mechanically machined as a very small, hollow, conical structure. Such a structure is fabricated using an appropriate focused ion beam (FIB) equipment using techniques to be further explained below. The enclosing/protecting structure also performs grinding or cutting of the specimen as will be explained below, and hence is also a nanoscale conical grinder or cutter.

The machined material emerges through a nanoscale aperture or hole at the apex of the protective structure for subsequent field evaporation. The actual length of the emerged material is variable depending on adjustment of the specimen feed, but typically ranges from being approximately flush with the aperture/hole to extending a length equal to the diameter of the aperture/hole. This arrangement might be considered as a nanoscale lathe where a tiny grinding/cutting tool is used to produce APT specimens that field evaporate from the end of the cutting tool. Conveniently, we may thus refer to the present embodiments as an atom probe nano-lathe (APNL) according to the instant principles.

In a highly preferred implementation of APNL, the above-explained protective structure is machined out of diamond because of its durable strength under APT conditions. However, any suitably durable material may be employed. The APNL technology of the present design with its protecting structure is suitable for analyzing biological specimen or other soft material that may otherwise be at risk of mechanical failure or disintegration in a standard APT equipment. An APNL arrangement or assembly 100 of the present design is shown in FIG. 4A, replacing puck 60 of the prior art shown earlier in FIG. 3.

Figure 3:
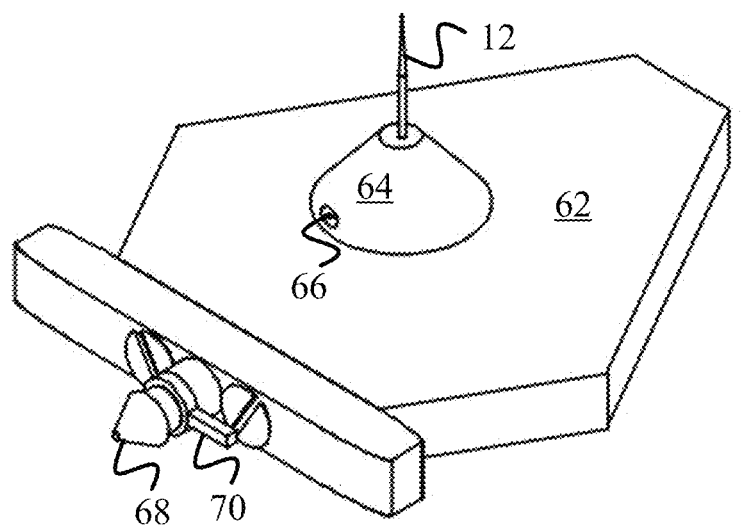
FIG. 3 shows a puck of an APT instrument of the prior art.

More specifically, FIG. 4A shows a cross-sectional view 100 of the APNL assembly of the above design where specimen 102 is held in place by a specimen holder 104. Specimen holder 104 may take any suitable design of the prevailing art, including mount 64 and set screw 66 of puck 60 of FIG. 3 presented earlier. The task of holder 104 is simply to mechanically hold the interior end 102A of specimen 102 in place during the APT process. FIG. 4A also shows the conical preform 102B of specimen 102 as well as its tip 102C and very end or terminus 102D. Critically, tip 102C of specimen 102 is surrounded and supported by protective structure 106 of the present design as shown. As noted, and will be further explained in detail, structure 106 also acts as a cutting/cutter or grinding/grinder tool for the specimen.

Therefore, protective structure 106 of the present APNL embodiments serves multiple purposes. First and foremost, it protects and stabilizes tip 102C of specimen 102 from exposure to the stress of the electrostatic field of APT. In the embodiment shown in FIG. 4A that is implemented in a local-electrode APT instrument, the electrostatic stress will be from the electric potential difference of nearby local-electrode 16 as shown. Secondly, protective structure 106 also acts as a nanoscale conical grinder/cutter or a nanoscale conical grinding/cutting tool that regularly machines tip 102C to produce a nanoscale terminus 102D emerging out of a nanoscale aperture/hole at its center (not shown). As noted, the actual length of terminus 102D is adjustable but typically is approximately equal to the diameter of the nanoscale aperture/hole.

Note that while it is tip 102C that most requires protection from electrostatic stress of the field of electrode 16 of the local-electrode APT implementation shown, the remainder of the specimen, including its interior end 102A and preform 102B are also protected from the APT environment. This is shown in the cross-sectional view of FIG. 4A where conical supporting member 112 shields or protects the remainder of the specimen from the APT-environment, while nanoscale terminus 102D is exposed from the aperture of protective structure 106. Supporting member 112 may take the shape of a copper mount, such as mount 64 presented earlier in FIG. 3.

The nanoscale terminus then undergoes field evaporation of the APT instrument per earlier explanation. FIG. 4B shows an enlarged view of the right-hand portion 120 of the view of FIG. 4A, including protective structure and nanoscale grinder/cutter 106 of APNL assembly/apparatus 100 of FIG. 4A. FIG. 4B also shows conical preform 102B of specimen 102, as well as its tip 102C surrounded by protective structure 106, and nanoscale terminus 102D exposed to local-electrode 16. Note that the material composing our nanoscale protective structure or grinder/cutter 106 does not field evaporate during operation. This is achieved by using materials with higher evaporation fields than the material composing specimen 102. In this regard, diamond is a very desirable material of choice for grinder/cutter 106.

In a typical APT configuration of the prior art, such as puck 60 of FIG. 3 used in a local-electrode APT instrument, most or entirety of needle-like specimen 12 would be exposed to the APT environment. Overcoming this shortcoming of the prior art, the present design only exposes the very end or nanoscale terminus 102D of specimen 102 to the harsh APT environment. As mentioned, specimen 102 has a conical preform 102B that may be somewhat blunt at the beginning of the operation, and is then continually grinded to an extremely sharp terminus 102D during APT analysis. For clarity of explanation, we refer to the portion of specimen that goes inside of protective structure 106 as tip 102C and the nanoscale portion that emerges from its aperture as its nanoscale terminus or simply terminus 102D.

The grinding action of protective structure 106 is accomplished by utilizing a rotary drive (not shown) that rotates specimen holder 104 as shown by arrow 108 in FIG. 4A. The rotary drive also has linear force adjustment as shown by arrow 110 as it rotates and pushes specimen 102 into protective structure and nanoscale grinder 106. As the rotation occurs, which may be clockwise or counter-clockwise, tip 102C of the specimen is grinded or cut by the inside walls of protective structure or nanoscale conical grinder 106 to terminus 102D of the specimen emerge through a nanoscale aperture/hole at the center of structure/tool 106.

To repeat, structure 106 provides multiple functionalities. On one hand its walls provide rigid support to the soft specimen, such as biospecimen. On the other hand, it is also a nanoscale cutter/grinder or cutting/grinding tool because its walls grind/cut tip 102C of rotating specimen 102 to emerge as an extremely sharp nanoscale terminus 102D from its nanoscale aperture. After its emergence from the nanoscale aperture of protecting/supporting structure 106, terminus 102D is exposed to local-electrode 16 and field evaporation of the APT instrument. As noted, because of the lathe-like operation of the above-mentioned design, the present embodiment may also be referred to a nanoscale lathe or more specifically an atom probe nanolathe (APNL).

The cross-sectional view of FIG. 4A of the instant APNL design shows supporting member 112 that holds protecting structure/tool 106 during the operation of the system. Supporting member 112 may also take the shape of a hollow cone with a narrow open end that supports protective structure 106. For completeness, FIG. 4A also shows a locking pin mechanism consisting of mounting pin 68 and lock 70 of the puck of FIG. 3 introduced earlier. Per prior explanation, a transfer arm/shuttle with a load-lock mechanism (not shown) is used to move APNL assembly 100 into the cryogenic and UHV analysis chamber of the APT instrument, and lock it in place with the help of mounting pin and lock 68 and 70 respectively. These embodiments are designed to be compatible with existing APT instruments as a replacement for the standard puck. There are also a number of variations conceived as will be explained in the below teachings.

The APNL embodiments as depicted and explained in reference to FIG. 4A-B obviate the need for prefabricated and extremely sharp needle-like APN-ready specimens normally produced by electrochemical etching or FIB. Because of the grinding capability of the design to continually produce APN-ready terminus 102D of specimen 102 in-situ, conical preform 102B and specifically tip 102C of specimen 102 do not need to be at nanoscale before operation begins. In the preferred embodiment, nanoscale terminus 102D is quasi-spherical or quasi-hemispherical with a radius in the range of 10 nm to 200 nm.

Protecting structure 106 has a hollow conical structure because tip 102C needs to be supported by its walls and has to pass through and grinded by it. FIG. 5 is a cross-sectional view showing even in further detail protective structure 106 with specimen tip 102C in it. FIG. 5 shows that protective structure 106 has an exterior cone 114 and an interior cone 116. In the preferred embodiment, exterior cone 114 has a full opening-angle in the range of 30°-60°, and the opening-angle of interior cone 116 has an opening-angle half the opening-angle of exterior cone 114. In other variations, the opening-angles of interior and exterior cones 116 and 114 respectively may be chosen as desired for a given implementation. In the embodiment shown in FIG. 5, the opening-angle of exterior cone 114 is 60° and that of interior cone 116 is 30°.

Minimizing the opening-angle of exterior cone 114 has the advantage of reducing the required operating voltage for field evaporation, and also avoiding compression of the ion trajectories into a narrower emission cone. However, having a larger opening-angle for exterior cone 114 makes the process of fabrication of protective structure 106 easier. Thus, it is a tradeoff, and the practitioner can reach the best compromise for a given implementation.

A bio-sample specimen, such as specimen 102 with its conical preform 102B and tip 102C is introduced into interior bore/cone 116 of protective structure 106. Evidently, the opening-angle of tip 102C must be less than that of the interior cone 116 or otherwise it would not fit in the interior cone of structure 106. Tip 102C supported by the wall of protecting structure 106 is nano-machined by grinding/cutting surfaces on the inside walls of interior cone 116 of protective structure/cutter 106. In the preferred embodiment shown in FIG. 4A-B, specimen 102 is rotated with respect to protective structure 106. An advantage of such an embodiment is the simplicity of the design because it allows employing one from a number of available rotary drive mechanisms to hold and rotate specimen 102.

However, in such a preferred embodiment, specimen 102 along with its tip 102C and terminus 102D may come to a stop from rotation at any orientation with respect to the X-Y axis of the particle detector (not shown in FIG. 5). As such, the reconstruction software of our APNL based APT implementation, will need to take into account the final angular or azimuthal orientation of the specimen. This is done by compensating for the transformed coordinate axes X'-Y' of specimen 102 using coordinate transformation techniques known in the art. Alternatively, the rotation can be arranged to always stop at the same azimuthal orientation. Still alternatively, it is also conceived that specimen 102 is always rotating, and the reconstruction software compensates for the constantly changing azimuthal orientation.

In alternative embodiments, supporting structure 106 with its grinding surfaces may be rotated against specimen 102 that is held stationary. An advantage of such a variation is that the X-Y coordinates of specimen 102 along with its tip 102C and terminus 102D stay fixed throughout the operation of the system. This eliminates the need by reconstruction software to compensate for any change or transformation in the coordinate axes of the specimen.

For all of the instant APNL embodiments disclosed herein, the term "rotation" as applied to the instant protective structure, such as structure 106 of FIG. 4A-B and FIG. 5, is understood to include continuous relative rotation of the protective structure/grinding tool with respect to the specimen in one direction (clockwise or counterclockwise) or oscillatory motion in alternate directions. This can further include more than one rotational step in one direction before reversing direction, or simple alternating rotation each time the rotation is started.

Finally, there is no specified minimum rotational angle implied in each step. In the finest limit, rotation can even include vibrational motion.

As noted above, protecting/protective/cutting structure/cone 106 has a nanoscale aperture for the machined material to exit. Note that at times we may simply refer to our protective structure 106 of FIG. 4A-B and FIG. 5 as simply a cone because of its overall conical shape, with the knowledge it actually has an interior and exterior cone per FIG. 5 and associated explanation.

Because of the durable nature of structure/cone 106, it does not field evaporate. Only the specimen material that is transferred to the very tip through the aperture/hole is removed. Bio-sample material 102 in a cylindrical shape having an interior end 102A is first preformed into rough conical preform 102B. Referring to FIG. 4A, tip 102C of preform 102B is then slid into protecting/grinding cone 106, and machined to produce an APT-ready nanoscale terminus 102D. This process can be done efficiently outside of the APT instrument after which APNL assembly 100 is loaded in the APT instrument to commence operation and analysis per above explanation.

Thus, a key innovation of the present design is to provide rigid physical support to soft or fragile specimen, such as a bio-sample, from all sides except for the very end or tip that is exposed to electrostatic field of the local-electrode. Fracturing of mechanically weak materials by large field-induced stress has always been a major challenge for APT, and this geometry greatly reduces and/or eliminates this risk. In addition, this geometry further reduces irregular field evaporation from the material due to electrostatic shielding of tip.

Unlike conventional APT samples, the eventual shape of nanoscale terminus 102D in FIG. 4A-B and FIG. 5 is un-tapered because the radius of the central hole or aperture of protective/grinding structure/cone 106 stays constant. This is due to the fact that structure 106 does not field evaporate during operation as noted above. FIG. 5 also shows in an exploded view terminus 102D of specimen 102 with a nominal radius r which is preferably in the range of 10-200 nm as noted above.

It should be understood that the radius of curvature of the tip region will generally differ between protective structure/cone/tool 106 itself and the emerging terminus 102D of the specimen. As previously described, the extension length of terminus 102D can also be varied. In the example illustrated in FIG. 5, terminus 102D is somewhat protruding from the aperture of tool 106, and it has a smaller radius of curvature r than that of the tool, which is labeled r'. In various embodiments, r' may be smaller or larger than r. Alternatively, the tip region of the tool may even have an essentially flat truncation. This is a somewhat idealized cross section of the tip region of tool 106. An actual tool tip will have some interior surface roughness and not possess a uniform linear taper due to the FIB processing used to create the final conical interior cone 116. Glass nanopipettes, which are described later can achieve a closer approximation to this idealized shape.

Because of the above-described un-tapered shape/profile of nanoscale terminus 102D, the form of the reconstructed image of the specimen is also an un-tapered cylinder. In addition to softer materials such as biological samples and polymers, the present design is also of utility for more conventional hard and rigid materials. The ease, lower cost, and more rapid production of APT specimens by the present APNL design provides a significant advantage over the techniques of the prevailing art.

Protecting/Grinding Structure/Cone Design and Fabrication

The superlative mechanical properties, thermal conductivity, field-evaporation resistance, and ability to be precisely machined by FIB make single-crystal diamond an ideal choice for protecting/supporting and grinding/cutting structure/cone 106 shown in FIG. 4A-B and FIG. 5. Diamond parts with radii down to 20 nm are well within the capabilities of available techniques, which include conical diamond "styli" having extremely small and precise tips produced using proprietary FIB lathe equipment. For this purpose, boron-doped diamond may be used for achieving electrical conductivity with the styli.

Exemplary single-crystal styli 140 and 142 from present day vendors, such as Norsam Technologies, Inc. are shown in the micrographs of FIG. 6A and FIG. 6B respectively. It is also possible to produce these styli with other hard materials as well. For the present design, the radii are substantially of the order of 100 nm, however radii in the range of 10 nm to 200 nm are preferably conceived.

FIG. 7 shows another detailed cross-sectional view of a sub-assembly 220 of a nanoscale protective/cutting structure/cone/tool or cutter/grinder 206 and associated elements of an instant APNL design. More specifically, FIG. 7 is a variation of FIG. 5 with the opening-angles of the interior and exterior cones of protecting structure/cone 206 smaller as compared to cone 106 of FIG. 5. The interior and exterior cones of structure/cone 206 are marked by reference numerals 216 and 214 respectively. Other reference numerals explicitly shown in FIG. 5 have been omitted for reasons of clarity. FIG. 7 is not drawn to scale comprehensively elucidate its various elements.

The diagram shows a conical specimen preform 202B and tip 202C supported and ground inside cutter 206 thereby producing APT-ready nanoscale terminus 202D emerging from the aperture end of the cutter. The actual length of terminus 202D may vary depending on the amount of specimen 202 supplied/fed to protective structure/cutter/cone 206 but is typically approximately flush with the exit aperture of structure 206, to extending a distance equal to the diameter of the aperture.

Let us now discuss the fabrication process of sub-assembly 220 in detail. Grinding/cutting/protective cone 206 is produced by first taking a conical diamond stylus and then fabricating it into its eventual hollow form with a central nanoscale hole/aperture. As will be explained, the stylus is affixed to a substrate disk 213 that has a dimple or depression as shown. The back of the stylus is then cut off using FIB. The stylus is then milled into protective/protecting/grinding structure/cone 206. After the fabrication of its eventual form is complete, substrate disk 213 along with structure 206 is then affixed to a supporting member 112 of the specimen holder such as a puck assembly per earlier explanation. Examples of some suitable diamond styli were shown in FIG. 6A-C. The above affixing is accomplished by FIB deposition of a "weld" material 218 to affix a diamond stylus to substrate disk 213. Other affixing techniques such as using adhesives are also conceivable.

A scanning electron microscope (SEM) micrograph of a similarly milled diamond wire-die 230 using FIB equipment available from vendors such as FEI company is shown in FIG. 8. This type of conical hole is milled into the base of diamond cone 206 of FIG. 7 after FIB cutting of the base per above explanation. The extrusion hole at the base is preferably in the range of 10-200 nm. Tungsten is a suitable adhesive material for weld 218 in the present example. The maximum length of the attached diamond cone that remains after cutting is preferably 20-30 microns. Longer cones are desirable, but are slow to produce due to the limited speed of standard FIB machining process. However, using a plasma FIB source can increase the speed of the rough machining, followed by slower and more precise FIB machining using a liquid metal ion source (LMIS) can produce longer cones.

A very important issue during above-mentioned milling of structure/cone 206, and more specifically its interior cone 216 of FIG. 7 is how to assure that interior cone 216 remains coaxial with outer cone 214, and also has the proper depth. Attempting to do this blindly from the back-side (that is, the left-hand side of FIG. 7) is not a trivial issue. Therefore, in one embodiment, a series of holes are milled from the outer side of cone 214 which intersect with the cone axis. FIG. 9 shows a top or side view a portion of exterior and interior cones 214 and 216 respectively from FIG. 7.

FIG. 9 also shows above-described alignment holes 222A, 222B, 222C, 222D, . . . that are aligned with axis 224 of interior/exterior cones 216/214. Note that the diameter of the holes is smaller than the diameter of interior cone 216. The holes are preferably drilled/machined all the way through from the top-side through to and out of the bottom side of the cones, or from one side to the other. There is another set of similar/identical holes machined rotated by 90° along axis 224 that are not explicitly shown in FIG. 9 to avoid clutter. Together these two set of holes provide viewports or visual markers for ensuring that interior cone 216 is milled coaxially with exterior cone 214 during FIB machining that is performed from base side of the cone.

In an alternative embodiment, instead of holes, longitudinal triangular slots (that is, with slot-length decreasing from the broad end of the cone to its narrow end) are milled from the outer surface of structure 206. Such an embodiment is shown in FIG. 10 which is a variation of FIG. 9 except that instead of holes 222A, 222B, . . . , we have a slot 226A. Like the holes, this tapered or triangular slot is also aligned with cone-axis 224. Like the alignment holes above, the slot is milled all the way through from one side of protective structure or cone 206 to its other side. There is also another similar or identical slot (not shown) that is milled in cone 206 that is separated from slot 226A by a 90° angle along cone axis 224. Alternately, the slot may be rectangular in shape.

Any number of such holes/slots may be milled so as to guide milling all the way to the very apex of cones 214 and 216. There is also no restriction as to the number and shape of the sets of the above holes or slots. There may be holes/slots separated by 60° along axis 224, or even more holes/slots set apart evenly around axis 224. Of course, one needs to ensure that enough material is left in structure 206 so as not compromise its integrity. In general, the holes/slots will be smaller than the diameter of interior cone 216. However, other geometries are conceivable where these holes or slots are larger, which would result in a modified surface geometry of interior cone 216.

By having at least two crossed sets of these holes, or at least a pair of slots, as milling proceeds one can directly observe based on the crossing point of the holes/slots where the central axis of the cone is from the back side. One can also further observe through these holes/slots how far down one has machined, based on hole-count or slot-width. These milled holes/slots or "vents" act as alignment crosshairs or viewports or fiducial markers. In the embodiment shown in FIG. 10, the tapered slots themselves would form pie-shaped cutting edges on the interior of cone 216, potentially eliminating most of the subsequent interior milling.

After interior cone 216 of FIG. 7 has been milled, vents 222 or 226 may remain open, or be sealed. In one embodiment they are left opened because as tip 202C is grinded the vents act as exits for the machined/chipped/ground/cut material debris/chips of the specimen to come out. Because the linear rate of movement of the specimen from the left-hand side of FIG. 7 to the right-hand side is so slow that very little debris is produced from the material being machined. Therefore, the material debris/chips does not pose a significant issue of contamination of the analysis chamber of the APT instrument. Some of this debris may also stay inside the vents. If material does not stay in this region, any fine debris is highly charged and very slowly deposits on the grounded and nearby local-electrode 16. In the event, local-electrode 16 is unacceptably contaminated, it can be easily replaced in these instruments.

Referring back to FIG. 7, let us now discuss substrate disk 213 holding protective structure 206 onto which protective/cutting cone 206 is mounted and affixed by FIB weld 218. To accomplish this, first a dimple/depression is created on substrate disk 213. Such a dimple can be conveniently created using a commercial dimple grinder available in the art. FIG. 11A shows a conceptual diagram of a grinding disk 215 of a dimple grinder. Grinding disk 215 rotates along with above-mentioned substrate disk 213 that is placed on a turn-table (not shown) of the dimple grinder. The circular motions of disks 215 and 213 are shown by dotted circular arrows, which may be clockwise or counter-clockwise as required. The result of the grinding rotations of disks 213 and 215 is a dimple 217 on disk 213 as shown in FIG. 11B. A hole is then drilled via FIB through the thin center of dimple 217 per present teachings.

In one embodiment, a diamond stylus 219, such as one from those presented in FIG. 6A-B and related explanation, is then passed through the hole from the concave side of dimple 217 and emerging on its flat side. FIG. 11A-B are also not drawn to scale for explanatory purposes. Stylus 219 is then affixed to disk 213 using FIB weld 218 of FIG. 7 and its remainder lower conical portion in the concave side of the dimple is removed or truncated via FIB. What remains on its flat side is the remainder of stylus 219 having a familiar outer conical shape of protective structure/cone 206 explained in reference to FIG. 7 and as shown in FIG. 11B. The remainder of stylus 219 is now FIB-milled to produce a hollow interior cone 216 of FIG. 7 and a nanoscale aperture through its apex per above explanation. In order to give a perspective of scale to the reader, in an exemplary implementation, the diameter of substrate disk 213 is several millimeters (mm) while that of cone 206 is approximately 100 times smaller.

In an alternate embodiment, diamond stylus 219 is passed through the central hole from the flat side of dimple 217 and emerging out into its concave side. In this embodiment, stylus 219 then attached to disk 213, and truncated and milled per above explanation from the flat side of disk 213.

At this stage, disk 213 is attached to supporting member 212 of FIG. 7, which is preferably a part of a customized puck. The attachment of dimpled substrate disk 213 to supporting member 212 is readily accomplished as the outer diameter of disk 213 is relatively large and is much thicker and rugged than the central region or dimple 217 where cone 206 is attached. Thus, substrate disk 213 with structure 206 can be mounted on supporting member 112 by a clip, a screw or an alternative mechanical or non-mechanical fastening technique.

It should be appreciated that unlike a pencil sharpener or microtome, which the APNL design shares some resemblances with, the machining of specimen 202 and specifically its tip 202C shown in FIG. 7 is actually a wear process. Thus, material is basically scraped off very slowly, rather than cut as an ultrathin ribbon (as in the case of an ultramicrotome). It is important that specimen 202 being machined is hard enough so as not to be subject to significant plastic deformation for proper mechanical erosion.

As is well known with surface lapping and polishing procedures, materials that are relatively hard and brittle are most suitable. This is the case with frozen-hydrated or polymer embedded samples machined at very low temperature, which behave as hard glassy materials. The diamond surface is not configured for microtome type of cutting. The surface of interior cone 216 of protective structure/cone 206 of FIG. 7 is preferably rough for efficient wear of tip 202C and this roughness can be achieved to the desired optimum level using FIB.

It should be understood that the rate of material removal in this process is extremely slow. For example, if we assume APT of $2 \times 10^6$ nm$^3$/day, and a cylinder of analyzed material having a diameter of 100 nm, the linear feed rate of material required to keep up with field evaporation is only about 10 nm/hour. An important point to take from this is that the design allows for very slowly wearing away material inside protecting/cutting structure 206 using extremely little linear force. This further allows sufficient time for wear particles to be removed from interior cone 216 through either the vents, or the back opening.

In some embodiments, specimen 202 is continually rotated because any vibration/wobbling characteristics are within an acceptable tolerance of the desired APT process. While FIM is virtually immune to mechanical vibration, local-electrode APT is not. Therefore, in alternative embodiments, the rotation of specimen 202 is not maintained while performing APT due to vibrations or wobbling motion of tip 202C. In such embodiments, the rotation is performed on an as-needed/on-demand basis or at regular intervals. Another reason for not requiring continuous rotation is the need to prevent consequent compensation in image reconstruction of continually changing angular or azimuthal orientation of specimen 202. However, this is not an issue in embodiments where protecting/cutting tool/structure 206 is the part being rotated per above explanation.

An issue to be aware of while stopping rotation is conceivable stiction issues, that is, having material of specimen 202, and specifically its tip 202C, resist restoration of rotation. In the worst-case scenario, this could cause the material to fracture from torsional strain. However, the innovative design of the present technology makes such a failure highly unlikely. That is because of a number of reasons, namely, the force between the two surfaces is very small, the edges of the cutting holes/slots are extremely sharp and small and are oriented in a direction that does not encourage digging into the material. In addition, diamond is known to have very low friction and stiction with other materials.

As an artifact of the fabrication of the nanoscale conical protective structure or cutter/grinder/cone 206 of FIG. 7 or 106 of FIG. 4A-B and FIG. 5 is that its very end is a hemisphere rather than an atomically pointed tip. This is desirable in the current design as the specimen can flow through the hemisphere in a cylindrical form before emerging from the nanoscale aperture at the center of the hemisphere.

However, the fabrication of the nanoscale aperture or hole requires some discussion. If milled from the outside (or right-hand side of structures 206/106), its diameter should ideally match that of the hemisphere and the cylinder of specimen material cut by the upstream tapered interior cones or cutting surfaces of protective structures 206/106.

Alternatively, the hole may be either slightly larger or smaller than the cylinder of the specimen material produced at the end of the tapered interior cones. If the hole is slightly larger, then material freely passes through the hole in the diamond tip. However, this produces a short section (several hundred nm) of specimen material that is not mechanically supported by the diamond material, and may be at risk of fracturing due to electrostatic stress. If the hole is slightly smaller, then the hole itself acts as part of the machining process. Preferably, the undersized hole is substantially within 10 nm of what would have been a perfect match. There is also some grinding away of a narrow annular area of material by the bottom surface of the hole.

In still other embodiments, the hole is cut from the inside while continually and automatically tapering down to the tip. Thus, there is no sudden transition in the diameter of the material in the tip region. For this purpose, a small pilot hole might be milled from the outside first, as a guide to tell exactly where the tip apex is located. The interior cone profile of the FIB machined aperture/hole may not have the idealized perfect linear taper illustrated in FIG. 5. However, there will be a continuous reduction of the inner diameter as the aperture is approached. This has the advantage of giving mechanical support to the specimen material right up to the aperture.

Still another embodiment employs a small glass nanopipette or nanotube to form cutting/protecting tool/cone/structures 106 and 206 of FIG. 4A-B, FIG. 5 and FIG. 7 respectively. Current glass micropipettes already have a hollow conical structure. Drawing small enough tips is routine with glass pipette technology. One can draw a glass nanopipette with a suitable shape for an instant protective structure/grinding tool 106/206. A taper angle large enough to duplicate the diamond tool of prior embodiments is produced. In addition, some roughening of the interior glass wall is carried out for causing abrasion of the grinded specimen material. An advantage of such glass nanopipettes is that they are inexpensively expendable as compared to the diamond tools of the prior embodiments. As previously noted, the drawing of glass nanopipettes may achieve a closer approximation to the linear taper profiles of interior and exterior cones 116 and 114 respectively shown in FIG. 5. This is due to the intrinsic nature of the glass drawing process, and the unnecessary final step of using FIB machining to open up the final tip aperture.

In still another embodiment, the nanomachining operation of the specimen material is performed by pushing the material through an appropriately designed cutting tool without rotation. This may be described as a nano-extrusion process. In such a design, the advantage of not requiring any rotation is clear based on above discussion.

Vapor/Thin Film Deposition Based Protective/Grinding Structure/Cone/Tool Design and Fabrication Let us now describe a very highly preferred set of embodiments that greatly simplify the fabrication process of the instant protective/grinding structure/cone/tool as described above. In these embodiments, the instant protective structure is produced by deposition of diamond or another suitably hard material onto a mold.

In one variation, the deposition is carried out on an otherwise flat silicon substrate but one that has one or more precision etch pits. The pits are conical (circular) in shape, pyramid-shaped, triangular, hexagonal or of any other suitable shape. The pits are depressed into the silicon substrate and into which a thin film of diamond or another material is deposited.

FIG. 12A shows such an exemplary silicon substrate 300 with pyramid-shaped pits 302A, 302B, and so on. Note only two such pits are marked by reference numerals in FIG. 12A for clarity. Pits 302A, 302B, . . . act as molds for producing hollow pyramidal structures once freed from silicon substrate 300. Anisotropic etching can be used to produce very precise such four-sided pyramid pits in silicon substrate 300.

It is also possible that instead of depressions, raised protrusions, projections or protuberances are used as molds onto which the thin film of diamond or another suitably hard material is deposited. Again, such protrusions may be conical (circular), pyramid-shaped, triangular, hexagonal or of another suitable shape/profile. FIG. 12B shows an exemplary silicon substrate 310 with (circular) conical protruding molds 312A, 312B, . . . as shown.

Preferably, the process used for depositing films/vapors in the present embodiments is chemical vapor deposition (CVD). It should be recognized that silicon is only one example of potential substrate materials that could be used for the molds. In the case of diamond deposition, the deposited material is nanocrystalline, rather than the single-crystal diamond previously used in the starting styli shown in FIG. 6A-B for making protective structure/cone 106 of FIG. 4A-B and FIG. 5 and structure/cone 206 of FIG. 7 and FIG. 9-12.

The size of the pointed ends of such raised or depressed molds in the present embodiments can be exceeding small, making them suitable for producing atomic force microscopy (AFM) tips. For conical molds the size can be represented by the diameter or radius of the base, and for pyramid-shape molds it could be the sides or the diagonal of the square base of the pyramid. To suit the needs of the present APNL design, the size of the pointed ends of the molds is preferably and easily made slightly larger than a near-atomically-sized end suitable for AFM tips. Enlarging the size of the pointed ends can conveniently and simultaneously produce a blunter end having a smooth or regular radius of curvature which is desirable.

Note here, that to be consistent with prior teachings we will still refer to the product of the above deposition process as our protective structure or cone knowing that its actual shape may be that of a pyramid. Note also, that the walls of the pyramid-shaped or conical protective structure of such a deposition process will be either un-tapered or substantially un-tapered. This is in contrast to the tapered walls and resulting interior and exterior cones 116/114 and 216/214 of FIG. 5 and FIG. 7 respectively have differing opening-angles. In other words, both the interior and exterior cones of the protective structures resulting from the thin film deposition process of the present embodiments will have the same opening-angles.

FIG. 13A shows an instant exemplary protective structure 320 that is pyramid-shaped with either un-tapered or substantially un-tapered walls. Similarly, FIG. 13B shows an exemplary protective structure 322 that is conical (circular) with un-tapered or substantially un-tapered walls per present embodiments. A hollow protective structure/cone, such as structures 320/322, thus obtained above is then ready to have its central aperture/hole milled and then mounted on the specimen holder, such as a puck, per above explanation.

Preferably, the deposition and the associated patterning process themselves are used to produce a cantilever support for the resulting cone. In such a variation, after the deposition of diamond or another suitable material onto the substrate with the mold, the cantilever support is patterned onto the coated substrate. Exemplary substrates 310/312 with molds 302/312 of FIG. 12A/FIG. 12B respectively presented earlier are applicable to such a process.

As noted, that the substrate is preferably composed of silicon. The cantilever support and the protective structure are produced by the same deposition process and are thus monolithic. The cantilever support along with structure 320/322 is then freed from the substrate. A relatively thick substrate material can be used as a rigid supporting "chip" for the monolithic cantilever support and the resulting hollow protective structure 320/322 of FIG. 13A/FIG. 13B respectively. This could be left over silicon substrate material after chemical etching and dicing, or another material such as a glass wafer that has been attached to the silicon substrate after diamond deposition.

The cantilever support with structure 320/322 along with the supporting chip is then simply mounted onto supporting member 112 of the embodiment described in FIG. 7, or alternatively onto another suitable mounting structure required for a given implementation. It should be understood that the "cantilever" support as discussed herein could be achieved with a multitude of different geometries. For the current design, any extended structure supporting our hollow protecting/protective/grinding structure 320/322 and connected to another more rigid structure is conceived. Two versions of such a cantilever support are described next.

FIG. 14A and FIG. 14B show respective micrograph images 330 and 332 of a conical preform, such as preform 102B/202B of FIG. 4A-B/FIG. 7, actually being inserted into an instant hollow pyramid-shaped protecting/protective/grinding structure 320 of FIG. 13A produced by the thin film/vapor deposition process of the present embodiments. Pyramid-shaped protecting/protective/grinding structure 320 is composed of nanocrystalline conductive diamond in the micrographs of FIG. 14A-B. Further, protective/grinding structure 320 is shown supported by a vertical cantilever support 333 that is monolithically produced by the deposition process per above explanation, and is therefore also composed of nanocrystalline conductive diamond. The total height of the pyramid above the cantilever surface is approximately 6 microns. The thickness of polycrystalline diamond film is approximately 1 micron. Such protective structures with cantilever supports are available with present day techniques from Advanced Diamond Technologies and possibly other vendors.

FIG. 14C and FIG. 14D are variations of FIG. 14A and FIG. 14B showing micrographs 334 and 336 respectively of an instant protective structure 320 produced by depositing monolithic conductive diamond on pyramid-shape molds (protrusions or depressions) of the present embodiments. Note that cantilever support 335 of FIG. 14C-D is triangular in shape. FIG. 14E is a low magnification micrograph 338 showing cantilever support 335 attached to silicon. Pyramid-shaped hollow instant protective structure 320 is the small pointed and darker structure at its apex end. This is currently a very practical way to produce the protective/protecting/enclosing grinding/cutting structure/cone of the instant APNL design. Structures with larger heights and base diameters are also feasible. All one has to is to mill a hole at the center of structure 320 and then to mount it per prior explanation. Note in FIG. 14D that cantilever support 335 is flexed after the insertion of specimen preform 102B/202B. This flexure can be employed for variable adjustment of lateral force feeding the specimen into structure 320/322 for the instant nanomachining process.

For completeness, FIG. 14F shows a high magnification micrograph 340 of a nicely coned micromachined tip 342 of a specimen after being sharpened and smoothed by the inside surface of an instant protective structure cutter/tool, such as structures 320/322 of FIG. 13A/FIG. 13B, produced by thin film deposition. The scale is 1 micron/division. The figure shows much smoother tip 342 of the specimen with an opening-angle (or anisotropic etching full-angle) of approximately 70.5°, as compared with the initial rougher conical preform 344 of the specimen with an opening-angle of approximately 30°.

In other variations, the resulting protective structure/cone from the thin film deposition process, such as structure 320/322 of FIG. 13A/FIG. 13B, is used as a starting stylus and affixed to substrate disk 213 with dimple 217 of FIG. 11A-B and related explanation. In such variations, substrate disk 213 with dimple 217 may be used to provide support to protective structure 320/322 rather than a monolithically deposited cantilever support. Some reinforcement of the structure/cone may also be performed if needed. One way to perform the reinforcement is by dipping the cone in a liquid polymer and drawing it out, thus forming a tapered reinforcement layer around the cone. In contrast to earlier embodiments, once the lower portion of the stylus is truncated per above explanation, the milling of the hollow interior cone of protective structure 320/322 is not required.

A hole at the apex of structure/cone 320/322 of FIG. 13A/13B is then made using FIB techniques as described in prior embodiments. One very attractive feature of the embodiment of structure 320 is that the interior of the cone already has a well-defined location for knowing where to mill the final aperture/hole. In other words, the interior walls of hollow pyramid-shaped protective structure 320 meet right where the hole should be machined from the interior. Furthermore, because extensive interior FIB machining of the cone is not required, it is possible to produce longer structures, which is desirable for increased mechanical stability. Another interesting feature of pyramid-shaped protective structure 320 of the present embodiments is that by its very geometry there is excess interior volume for the accumulation of chip/abrasion material.

Whether it is pyramid-shaped protective structure 320 of FIG. 13A or conical protective structure of FIG. 13B, the interior walls whether un-tapered or substantially un-tapered of the cutting part can be intentionally made rougher for better abrasion by FIB processing at the same time as the final hole at the end is machined. Vents, such as holes/slots described earlier in reference to FIG. 9-10 and related explanation can also be optionally milled in any of the above variations to allow for exiting of material grounded/cut debris/chips.

APNL Rotary Drive

In a highly preferred embodiment, instant APNL design, such as that represented in FIG. 4A is mechanically engineered/integrated into a puck-compatible replacement that fits into the available space in the analysis chamber of an existing APT instrument. Further, the above-taught APNL design that is a customized version of a puck and replaces the traditional puck design is conceived to be integrated with a miniature rotational drive/stage.

The above requires an innovative approach due to issues including limited space, cryogenic temperature, UHV conditions, and the high electrical potential of the sample. In the preferred embodiment, instant protective/cutting tool/structure, such as protective structure 206 of FIG. 7 is used only intermittently. A small length of nanoscale terminus 202D of the order of 10 nm is produced at each of the intermittent steps and then field evaporated while feeding the material by a linear motion of the rotary drive. The load on the rotary drive motor is extremely small.

To enable such a design, a number of compact stepper or continuous-motion motors that are UHV and cryogenically compatible are commercially available. They employ either electromagnetic or piezoelectric drive technology. However, the high potential of the sample needs to be taken into account. For this purpose, customization of the present-day APT instruments is performed to permit motor power/control wires to be attached inside the analysis chamber. Also required is the isolation of motor drivers from the high-voltage of the puck mounting fixture in the analysis chamber.

Therefore, a variation runs the electric motor using power transmitted through free space or in other words, wirelessly. An exemplary wireless embodiment uses a light source such as a laser beam introduced through a viewport, and incident on a photovoltaic cell or cells connected to the motor for producing the power required by it. Another variation uses inductive wireless power transmission using coils by employing techniques known in the art. Still other forms of wireless forms of power transmission are conceivable.

Still another variation employs a purely mechanically powered system for the rotary drive. In such a variation, the movement similar to a mechanical watch movement is constructed. Many mechanical watches run very accurately at well below freezing temperatures. Moreover, it has been found that it is possible to operate some commercial watch movements using a standard Swiss lever escapement mechanism at liquid nitrogen temperature. In a mechanical watch, a mainspring is used for energy storage, and a balance wheel/escapement is used to control the rate of the gears powered by the mainspring. In the present variation, the movement is wound externally and then the puck is placed and locked in the analysis chamber of the APT instrument before commencing operation. In addition to the Swiss lever escapement, there are also other purely mechanical and compact movements that available using prevailing techniques that can be applied for this motion.

Accordingly, a related variation simply uses an actual commercial watch movement for the rotary drive. For this purpose, all lubricating oil is removed to avoid freezing and seizing of the bearings, as well as making it UHV compatible. Any change in the accuracy of the watch movement at low temperature is not important. Still in other variations, another simple mechanical drive mechanism that is compact enough for the available space is used.

Turning the motor on and off is achieved with a mechanical switch. For this purpose, the existing transfer arm/shuttle mechanism described earlier is used as vacuum wobble-stick manipulator for operating the switch. The recovery time for the analysis chamber vacuum is very fast after removing the transfer arm. In the preferred embodiment, the puck remains in place at all times during the switching on/off of the motor drive.

In a related embodiment, a bimetallic strip is utilized. In such an embodiment, the strip is thermally switched wirelessly by heating due to an external laser beam focused on the strip. It is straightforward in the present and prior embodiments to have the rotation stop consistently at the same azimuthal/angular position by having a mechanical stop in the mechanism using techniques known in the art. All that is required is a viewport for introduction of light to operate the motor switch in this bimetallic switch embodiment.

Nanopipettes Containing Frozen Samples

In addition to the atom probe nano-lathe (APNL) design of the prior embodiments where soft specimen is machined to produce a nanoscale terminus in-situ, let us now discuss a set of highly preferred embodiments that employ samples frozen inside nanopipettes sometimes also referred to as nanotubes. Preferably, the nanopipettes/nanotubes are made of carbon, however, any other suitable material may also be used. Recall, that in an earlier set of APNL embodiments, we have already used glass nanopipettes/nanotubes having nanoscale end-dimensions suitable for APT.

Thus, in the present embodiments, the protective structure of the instant design that is used to stabilize the soft specimen, such as bio-samples, is a nanopipette or nanotube. Preferably, the nanopipette/nanotube is made out of carbon. Instead of machining a nanoscale terminus as in the prior APNL embodiments, the sample in the tip of the nanopipette is first frozen and then analyzed.

Carbon nanopipettes/nanotubes have recently been developed that are suitable to implement the protective structure of the present embodiments based on the instant principles. FIG. 15 shows micrographs 350A and 350B of an exemplary nanopipette available with prevailing techniques that may be used for the instant protective structure. More specifically, reference numeral 350A depicts a low magnification micrograph of the glass plus carbon sections of a nanopipette. Reference numeral 350B is used to depict a higher magnification micrograph of the pure carbon end-section that is used to hold the soft specimen and acts as the protective structure around it, following the larger diameter glass section of the nanopipette/nanotube. This exemplary nanopipette is published in the reference entitled "Small diameter carbon nanopipettes" by Riju Singhal et al. of Drexel University, Philadelphia, Pa. dated November 2009. Additional examples of existing nanopipettes suitable for present embodiments include those described in U.S. Pat. Nos. 8,702,927 and 8,877,518 to Bau et al.

It should be understood that the carbon nanopipettes published in the above-mentioned NPL reference as well as those described in the above-mentioned patents represent just one particular and preferred method for their fabrication. There are other possible means for the production of similar structures. The present scope also covers the use of similar thin-walled small diameter structures or tubes for APT of materials enclosed within their interior. Preferably, though not exclusively, such nanotubes are made out of carbon. The term "carbon nanotube" in the literature is sometimes used to describe similar nanoscale tubes of carbon or other materials. In many instances, such tubes in the literature have a wall thickness of only one atomic layer. For the purposes of the instant invention, both "nanopipettes" and "nanotubes", as well as "carbon nanotubes" are conceived for producing instant protective structures that have sufficient rigidity for holding and protecting soft or other desired specimens.

The main aspect of the present embodiments is that instead of machining an APT-ready nanoscale terminus of the APNL embodiments, specimen material is introduced/sucked/pipetted into a nanopipette/nanotube, such as a carbon nanopipette/nanotube. The nanopipette acts as the protective structure in the present embodiments stabilizing and protecting the soft specimen from the harsh APT conditions. However, as in earlier APNL embodiments, only a very small/sharp nanoscale terminus is exposed to the analysis chamber of the APT instrument. The sample is first frozen inside the nanopipette, and then analyzed by field evaporation of the nanopipette and the sample terminus. In one interesting application, a small sample from inside a single living cell is extracted and is then frozen and analyzed.

It should be noted that in the present embodiments, it is both the nanopipette/nanotube along with the nanoscale terminus of the specimen that get field evaporated. Together, the two maintain an extremely sharp nanoscale size of the prior embodiments having a quasi-spherical shape with a radius preferably in the range of 10-200 nm. Since there is no force pushing the specimen out of the nanopipette protective structure, it is necessary for both the nanopipette tip as well as the specimen terminus to be subject to the field evaporation and consequent consumption.

Further, the protective structure/cone of the nanopipette/nanotube is extremely strong and rigid and can be extended into a long and low-divergence cone. Therefore, the field evaporation of both the nanoscale terminus of the specimen and nanopipette tip can continue for durations long enough for performing APT analysis while still maintaining the nanoscale size of the terminus/tip. Evidently, the reconstructed three-dimensional atomic-scale map in the present embodiments will include an outer layer of carbon nanopipette around the specimen.

It is noted that different evaporation fields of the sample terminus compared to the nanopipette may result in the radius of curvature of the sample material becoming larger than the nanopipette material over time. However, having flatter regions on a tip after field evaporation is commonly encountered, even in homogeneous materials, where different crystal planes have different radii. As a result, some ion trajectory changes may occur but within an acceptable tolerance for most applications. This can be further addressed in the image reconstruction software.

In an implementation of the present embodiments, nanopipette or nanotube with the bio-sample extracted in it is mounted on a puck, exemplarily using mount 64 and set-screw 66 of puck 60 of FIG. 3. In this implementation, instead of specimen 12 of FIG. 3, a nanopipette is mounted on the puck after the bio-sample is extracted/sucked in it. Reference numeral 350C of FIG. 15 is used to depict a bio-sample being extracted/sucked/pipetted from a single biological cell into a carbon nanopipette/nanotube of the present embodiments.

Puck 60 along with the bio-sample in its nanopipette/nanotube is then immersed in a cryofixation medium, most commonly at liquid nitrogen temperature thus rapidly freezing the bio-sample. The low-temperature puck with the attached nanopipette/nanotube containing the frozen specimen/sample is then introduced into the APT instrument using a cryo-transfer stage. The cryogenic conditions of the APT maintain the frozen state of the bio-sample in the nanopipette which is then field-evaporated and analyzed per above teachings. In this manner, it is also possible to analyze other resin embedded samples/specimens that are first transformed into a rigid state by a curing step and then moved into the chamber for APT analysis.

Advantages of carbon nanopipettes as protective structures are their much stronger strength, which permit much thinner thickness of the walls of the structure/cone. The present embodiments using nanopipettes are well suited for bio-sampling from a single cell, whereas the prior embodiments using the instant APNL technology seem well suited for sampling bulk biomaterials, however, the invention admits of vice versa as also a distinct possibility.

As noted earlier that because of the pervasive use of local-electrode APT configuration as the primary APT technology, many of the above teachings are provided with the puck assembly of a local-electrode APT instrument as an example to facilitate the practitioner. However, instant principles taught herein to stabilize soft specimen, including bio-samples, from disintegration/failure are in no way restrictive to a local-electrode APT instrument. The innovative principles of the present design are not restricted to a puck of a local-electrode APT instrument. Nor are they restricted to a specific type of specimen loading/holding mechanism for any form of an APT instrument, and whether such a mechanism is referred to as a puck in the industry jargon or not.

Therefore, implementations based on other forms of APT configurations are entirely conceivable. In fact, the present principles may also be extended to a "stub" of an electron microscope or other forms of charged-particle microscopy in general. Skilled artisans will be able to apply the present principles to appropriate specimen holding/loading mechanisms of such other forms of microscopy using teachings provided in this disclosure.

Both the APNL based and nanopipette/nanotube based embodiments may also employ multiple tips on a single mount in a "coupon tips" arrangement known in the art. For this purpose, appropriate configuration changes in the puck or other specimen holding/loading assemblies may be performed by applying the teachings provided herein.

As noted above, whether using APNL embodiments or nanopipettes employing frozen samples, the present techniques extend the benefits of APT to soft materials, including bio-samples. The end result or product created by the reconstruction software is a detailed three-dimensional atomic-scale or molecular-level map/structure of the exposed nanoscale terminus of the soft specimen. The atomic-level map of the specimen had only been routinely possible for hard/rigid specimens with the techniques of the prior art, while the present invention extends the benefits of traditional APT to biospecimen and more generally to other soft materials, such as polymers.

In view of the above teaching, a person skilled in the art will recognize that the apparatus and method of invention can be embodied in many different ways in addition to those described without departing from the principles of the invention.

Therefore, the scope of the invention should be judged in view of the appended claims and their legal equivalents.

What is claimed is:

1. A method of analyzing a soft specimen in an atom probe tomography (APT) instrument, said method comprising the steps of:
   (a) surrounding said soft specimen in a protective structure fabricated from material able to withstand stress of an electrostatic field of said APT instrument;
   (b) exposing only a nanoscale terminus of said specimen for field evaporation under an influence of said electrostatic field; and
   (c) performing said analyzing by reconstructing a three-dimensional atomic-scale map of said nanoscale terminus.

2. The method of claim 1 providing said APT instrument to be a local-electrode APT instrument.

3. The method of claim 1 providing said nanoscale terminus to be quasi-spherical having a radius in the range of 10-200 nanometers.

4. The method of claim 1 providing said soft specimen to comprise a biological material.

5. The method of claim 1 providing said protective structure to be a nanoscale conical grinder performing said exposing by grinding a conical preform of said soft specimen and thereby producing said nanoscale terminus in-situ.

6. The method of claim 5 providing said nanoscale conical grinder to be fabricated by depositing a thin film of a hard material onto one of a conical and a pyramid-shaped mold.

7. The method of claim 6 including in said depositing a cantilever support for said nanoscale conical grinder.

8. The method of claim 5 providing said nanoscale conical grinder to be fabricated from a conical diamond stylus.

9. The method claim 5 integrating said nanoscale conical grinder into a puck assembly and transferring said puck assembly into said APT instrument by a transfer arm for said analyzing.

10. The method of claim 5 where said grinding is performed by rotating said soft specimen with respect to said nanoscale conical grinder.

11. The method of claim 5 milling a plurality of vents in said nanoscale conical grinder.

12. The method of claim 11 providing said vents to be circular in shape.

13. The method of claim 11 providing said vents to be triangular in shape.

14. The method of claim 1 providing said protective structure to be a nanopipette and freezing said soft specimen in said nanopipette after said step (a).

15. The method of claim 14 providing said nanopipette to be made out of carbon and also subjecting the tip of said nanopipette to said field evaporation.

16. The method of claim 14 extracting said soft specimen from a single biological cell.

17. The method of claim 1 providing said protective structure to be a glass nanopipette.

18. An atom probe tomography (APT) instrument comprising:
(a) a protective structure surrounding a soft specimen, said protective structure fabricated from material able to withstand stress of an electrostatic field of said APT instrument; and
(b) a nanoscale terminus of said soft specimen exposed from said protective structure to said electrostatic field;
wherein ions liberated from said nanoscale terminus due to field evaporation under an influence of said electrostatic field are analyzed to reconstruct a three-dimensional atomic-scale map of said nanoscale terminus of said soft specimen.

19. The APT instrument of claim 18 configured as a local-electrode APT instrument.

20. The local-electrode APT instrument of claim 19 wherein said nanoscale terminus is quasi-hemispherical with a radius in the range of 10-200 nanometers.

21. The APT instrument of claim 18 wherein said soft specimen is a biological sample.

22. The APT instrument of claim 18 wherein said protective structure is a nanotube.

23. The APT instrument of claim 22 wherein said nanotube is made from carbon and said soft sample is frozen before said nanoscale terminus is exposed in element (b) to said electrostatic field.

24. The APT instrument of claim 22 wherein said nanotube is made out of glass.

25. The APT instrument of claim 18 wherein said protective structure is a nanoscale conical cutter used for cutting a conical preform of said soft specimen to produce said nanoscale terminus in-situ.

26. The APT instrument of claim 25 wherein said cutting is done by utilizing a motor that rotates said soft specimen having said conical preform in an interior cone of said nanoscale conical cutter.

27. The APT instrument of claim 26 wherein said motor is integrated with a puck and powered wirelessly from outside of the analysis chamber of said APT instrument.

28. The APT instrument of claim 26 wherein said motor is powered by a mechanical movement.

29. The APT instrument of claim 25 wherein said nanoscale conical cutter is fabricated from a diamond stylus.

30. The APT instrument of claim 25 wherein said nanoscale conical cutter is deposited as a thin film of diamond on one of a pyramid-shaped and a conical mold.

31. The APT instrument of claim 30 wherein a cantilever support is also monolithically deposited along with said nanoscale conical cutter.

32. The APT instrument of claim 25 wherein said nanoscale conical cutter has vents.

* * * * *